(12) United States Patent
Luo et al.

(10) Patent No.: US 11,901,287 B2
(45) Date of Patent: Feb. 13, 2024

(54) MICROELECTRONIC DEVICES WITH MULTIPLE STEP CONTACTS EXTENDING TO STEPPED TIERS, AND RELATED SYSTEMS AND METHODS

(71) Applicant: Micron Technology, Inc., Boise, ID (US)

(72) Inventors: Shuangqiang Luo, Boise, ID (US); Lifang Xu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 219 days.

(21) Appl. No.: 17/476,344

(22) Filed: Sep. 15, 2021

(65) Prior Publication Data
US 2023/0063111 A1    Mar. 2, 2023

Related U.S. Application Data

(60) Provisional application No. 63/239,984, filed on Sep. 2, 2021.

(51) Int. Cl.
*H01L 23/522* (2006.01)
*H01L 21/768* (2006.01)
*H10B 69/00* (2023.01)

(52) U.S. Cl.
CPC .... *H01L 23/5226* (2013.01); *H01L 21/76816* (2013.01); *H10B 69/00* (2023.02)

(58) Field of Classification Search
CPC .......... H01L 23/5226; H01L 21/76816; H10B 69/00; H10B 41/50; H10B 43/50
See application file for complete search history.

(56) References Cited

U.S. PATENT DOCUMENTS 9,520,402 B1 * 12/2016 Haller ................... H01L 23/528
10,373,970 B2    8/2019 Lee
10,593,624 B2    3/2020 Thimmegowda et al.
(Continued)

FOREIGN PATENT DOCUMENTS

CN    112038346 A    12/2020
CN    112470275 A    3/2021
(Continued)

OTHER PUBLICATIONS

International Search Report for International Application No. PCT/US2022/075704, dated Dec. 20, 2022, 3 pages.
(Continued)

*Primary Examiner* — Shahed Ahmed
*Assistant Examiner* — Vicki B. Booker
(74) *Attorney, Agent, or Firm* — TraskBritt

(57) ABSTRACT

Microelectronic devices include a stack structure having a vertically alternating sequence of insulative structures and conductive structures arranged in tiers. At least one stadium, of stadiums within the stack structure, comprise staircase(s) having steps provided by a group of the conductive structures. Step contacts extend to the steps of the staircase(s) of the at least one of the stadiums. Each conductive structure of the group of conductive structures has more than one of the step contacts in contact therewith at at least one of the steps of the staircase(s). Additional microelectronic devices are also disclosed, as are methods of fabrication and electronic systems.

24 Claims, 29 Drawing Sheets

(56) References Cited

U.S. PATENT DOCUMENTS

| | | |
|---|---|---|
| 10,879,267 B1 | 12/2020 | Luo et al. |
| 10,978,478 B1 | 4/2021 | Yip |
| 2012/0280299 A1 | 11/2012 | Yun et al. |
| 2014/0054787 A1 | 2/2014 | Eun et al. |
| 2017/0263556 A1* | 9/2017 | Tessariol ............. H01L 23/5283 |
| 2019/0139978 A1 | 5/2019 | Kim et al. |
| 2019/0371728 A1* | 12/2019 | Gossman .......... H01L 21/76816 |
| 2020/0144292 A1 | 5/2020 | Lee |
| 2021/0057336 A1 | 2/2021 | Shao et al. |
| 2021/0126009 A1 | 4/2021 | Luo et al. |
| 2021/0126010 A1 | 4/2021 | Luo et al. |
| 2021/0134736 A1 | 5/2021 | Jhothiraman et al. |
| 2021/0151455 A1 | 5/2021 | Xu et al. |
| 2021/0242131 A1 | 8/2021 | Ong et al. |
| 2021/0257298 A1 | 8/2021 | Xu et al. |

FOREIGN PATENT DOCUMENTS

| | | |
|---|---|---|
| TW | 202034459 A | 9/2020 |
| TW | I720887 B | 3/2021 |
| WO | 2021114178 A1 | 6/2021 |

OTHER PUBLICATIONS

International Written Opinion for International Application No. PCT/US2022/075704, dated Dec. 20, 2022, 3 pages.

U.S. Appl. No. 17/373,528, filed Jul. 12, 2021, "Microelectronic Devices With Active Source/Drain Contacts in Trench in Symmetrical Dual-Block Structure, and Related Systems and Methods," Xu et al., 73 pages.

Taiwanese Search Report and Office Action from Taiwanese Application No. 111133375, dated Apr. 13, 2023, 13 pages with English translation.

* cited by examiner

MICROELECTRONIC DEVICES WITH MULTIPLE STEP CONTACTS EXTENDING TO STEPPED TIERS, AND RELATED SYSTEMS AND METHODS

CROSS-REFERENCE TO RELATED APPLICATION

This application claims the benefit under 35 U.S.C. § 119(e) of U.S. Provisional Patent Application Ser. No. 63/239,984, filed Sep. 2, 2021, the disclosure of which is hereby incorporated in its entirety herein by this reference.

TECHNICAL FIELD

Embodiments of the disclosure relate to the field of microelectronic device design and fabrication. More particularly, the disclosure relates to microelectronic devices (e.g., memory devices, such as 3D NAND memory devices) including contacts extending to conductive structures of a tiered stack including the conductive structures vertically alternating with insulative structures. The disclosure also relates to methods for forming such devices and to systems incorporating such devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source structure (e.g., a source plate, a source line). A 3D NAND memory device also includes electrical connections between, e.g., access lines (e.g., word lines) and other conductive structures of the device so that the memory cells of the vertical strings can be selected for writing, reading, and erasing operations.

One method of forming such electrical connections includes forming a so-called "staircase" structure having "steps" (or otherwise known as "stairs") at edges (e.g., adjacent ends) of the tiers of the stack. The steps define contact regions of conductive structures of the device, such as access lines (e.g., word lines), which may be formed by the conductive materials of the tiered stack. Contact structures may be formed in physical contact with the steps to provide electrical access to the conductive structures (e.g., word lines) associated with the steps. The contact structures may be in electrical communication, via conductive routing lines, to additional contact structures that communicate to a source/drain region.

A continued goal in the microelectronic device fabrication industry is to reliably fabricate the features of microelectronic devices so that the devices function as intended, including effective electrical communication between electrically conductive features, such as contact structures and the steps formed in the tiered stack. However, this continues to present challenges, particularly as failure to accurately fabricate one contact structure may, in conventional device designs, render electrically inaccessible a corresponding conductive structure (e.g., word line) and may also render inoperable a whole group of device features.

DETAILED DESCRIPTION

Figure 1:
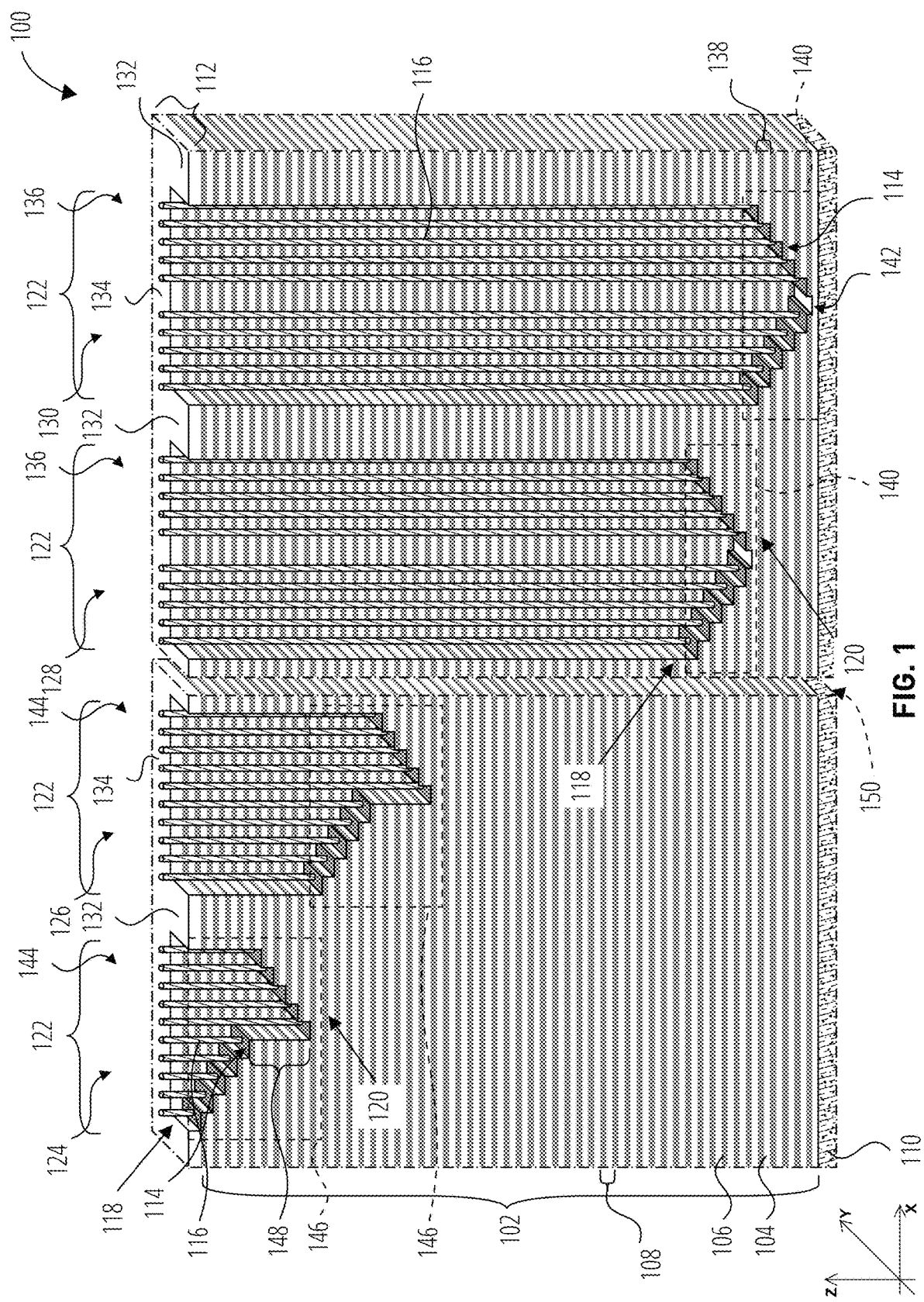
FIG. 1 is a schematic, cross-sectional, perspective view of a microelectronic device structure, according to embodiments of the disclosure, wherein, in at least one stadium (a "multi-step-per-tier stadium"), each stepped tier includes multiple steps and multiple step contacts extend to each stepped tier.

Structures (e.g., microelectronic device structures), apparatuses (e.g., microelectronic devices), and systems (e.g., electronic systems), according to embodiments of the disclosure, include a stack of vertically alternating conductive structures and insulative structures arranged in tiers. A series of stadiums is formed in the tiered stack. The stadiums include staircase structures having steps defined by ends (e.g., horizontal surfaces adjacent sidewalls) of at least one of the conductive structures of the tiers of the stack and having risers defined by ends (e.g., vertical surfaces) of at least one of the conductive structures and at least one of the insulative structures of the tier. For at least some of the tiers of the stack, such as the deepest tiers of the stack, multiple steps are formed per tier (e.g., per conductive structure (e.g., per word line)) or relatively-wider and/or relatively-longer steps are formed per tier. At least one conductive "step contact" (e.g., access line contact, word line contact) extends to each step. For the tiers with multiple defined steps (or relatively-wider and/or relatively-longer defined steps), multiple step contacts are formed to be in electrical communication with the conductive structure (e.g., word line) of each such tier. Therefore, should one of the step contacts not be accurately fabricated—for example, due to challenges with fabricating step contacts that extend to the deepest tiers—an accurately-fabricated step contact extending to another portion (e.g., another step) of the tier nonetheless provides directly physical contact to and electrical communication with the conductive structure (e.g., access line, word line) of the tier. The multiple step contacts may, therefore, function as "back-up" step contacts for a particular tier of the stack, significantly lessening the likelihood of complete failure to electrically access any one conductive structure (e.g., word line) in a fabricated microelectronic device. Therefore, and where an electrical communication failure with any one tier of a stadium may otherwise exhibit as a whole-stadium failure (e.g., a stadium "read" or "write" error), including multiple step contacts per tier may significantly lessen the likelihood of such whole-stadium failures.

As used herein, the term "descending staircase" means and refers to a staircase generally exhibiting negative slope.

As used herein, the term "ascending staircase" means and refers to a staircase generally exhibiting positive slope.

As used individually herein, the terms "multiple," "group," and "set" each mean and refer to there being more than one of (e.g., a "plurality of") the indicated features, and these terms may be used interchangeably. As used in combination herein (e.g., a "set of multiple," "a group of multiple"), the terms mean and refer to there being more than one of the pluralities of the indicated features.

As used herein, the term "high-aspect-ratio" means and refers to a height-to-width (e.g., a ratio of a maximum height to a maximum width) of greater than about 10:1 (e.g., greater than about 20:1, greater than about 30:1, greater than about 40:1, greater than about 50:1, greater than about 60:1, greater than about 70:1, greater than about 80:1, greater than about 90:1, greater than about 100:1).

As used herein, a feature referred to with the adjective "source/drain" means and refers to the feature being configured for association with either or both the source region and the drain region of the device that includes the "source/drain" feature. A "source region" may be otherwise configured as a "drain region" and vice versa without departing from the scope of the disclosure.

As used herein, the terms "opening," "trench," "slit," "recess," and "void" mean and include a volume extending through or into at least one structure or at least one material, leaving a gap in that at least one structure or at least one material, or a volume extending between structures or materials, leaving a gap between the structures or materials.

Unless otherwise described, an "opening," "trench," "slit," and/or "recess" is not necessarily empty of material. That is, an "opening," "trench," "slit," or "recess" is not necessarily void space. An "opening," "trench," "slit," or "recess" formed in or between structures or materials may comprise structure(s) or material(s) other than that in or between which the opening is formed. And, structure(s) or material(s) "exposed" within an opening, trench, slit, or recess is/are not necessarily in contact with an atmosphere or non-solid environment. Structure(s) or material(s) "exposed" within an opening, trench, slit, or recess may be adjacent or in contact with other structure(s) or material(s) that is/are disposed within the opening, trench, slit, or recess. In contrast, unless otherwise described, a "void" may be substantially or wholly empty of material. A "void" formed in or between structures or materials may not comprise structure(s) or material(s) other than that in or between which the "void" is formed. And, structure(s) or material(s) "exposed" within a "void" may be in contact with an atmosphere or non-solid environment.

As used herein, the terms "substrate" and "base structure" mean and include a base material or other construction upon which components, such as those within memory cells, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the terms "insulative" and "insulating," when used in reference to a material or structure, means and includes a material or structure that is electrically insulative or electrically insulating. An "insulative" or "insulating" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "sacrificial," when used in reference to a material or structure, means and includes a material or structure that is formed during a fabrication process but which is removed (e.g., substantially removed) prior to completion of the fabrication process.

As used herein, the term "horizontal" means and includes a direction that is parallel to a primary surface of the substrate on which the referenced material or structure is located. The "width" and "length" of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The "width" of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The "length" of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "vertical" means and includes a direction that is perpendicular to a primary surface of the substrate on which a referenced material or structure is located. The "height" of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along an indicated "X" axis in a horizontal plane (e.g., at a certain elevation, if identified), defining a maximum distance, along such "X" axis in the horizontal plane, of the material or structure in question.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question.

As used herein, the terms "thickness" or "thinness" are spatially relative terms that mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material or structure relative to at least two other materials or structures. The term "between" may encompass both a disposition of one material or structure directly adjacent the other materials or structures and a disposition of one material or structure indirectly adjacent to the other materials or structures.

As used herein, the term "proximate" is a spatially relative term used to describe disposition of one material or structure near to another material or structure. The term "proximate" includes dispositions of indirectly adjacent to, directly adjacent to, and internal to.

As used herein, the term "neighboring," when referring to a material or structure, is a spatially relative term that means and refers to a next, most proximate material or structure of an identified composition or characteristic. Materials or structures of other compositions or characteristics than the identified composition or characteristic may be disposed between one material or structure and its "neighboring" material or structure of the identified composition or characteristic. For example, a structure of material X "neighboring" a structure of material Y is the first material X structure, e.g., of multiple material X structures, that is most proximate to the particular structure of material Y. The "neighboring" material or structure may be directly adjacent or indirectly adjacent the structure or material of the identified composition or characteristic.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—is a relative term that means and includes the parameter, property, or condition of the two such structures, materials, features, or portions being equal, substantially equal, or about equal, at least in terms of respective dispositions of such structures, materials, features, or portions. For example, two structures having "consistent" thickness as one another may each define a same, substantially same, or about the same thickness at X lateral distance from a feature, despite the two structures being at different elevations along the feature.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, the terms "on" or "over," when referring to an element as being "on" or "over" another element, are spatially relative terms that mean and include the element being directly on top of, adjacent to (e.g., laterally adjacent to, horizontally adjacent to, longitudinally adjacent to, vertically adjacent to), underneath, or in direct contact with the other element. It also includes the element being indirectly on top of, adjacent to (e.g., laterally adjacent to, horizontally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, any spatially relative terms used in this disclosure are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the lowest illustrated surface of the structure that includes the materials or features. As used herein, a "level" and an "elevation" are each defined by a horizontal plane parallel to a primary surface of the substrate or base structure on or in which the structure (that includes the materials or features) is formed. When used with reference to the drawings, "lower levels" and "lower elevations" are relatively nearer to the bottom-most illustrated surface of the respective structure, while "higher levels" and "higher elevations" are relatively further from the bottom-most illustrated surface of the respective structure.

As used herein, the term "depth" is a spatially relative term used to describe one material's or feature's relationship to another material(s) or feature(s) as illustrated in the figures, using—as a reference point—the highest illustrated surface of the structure that includes the materials or features. When used with reference to the drawings, a "depth" is defined by a horizontal plane parallel to the highest illustrated surface of the structure that includes the materials or features.

Unless otherwise specified, any spatially relative terms used in this disclosure are intended to encompass different orientations of the materials in addition to the orientation as depicted in the drawings. For example, the materials in the drawings may be inverted, rotated, etc., with the "upper" levels and elevations then illustrated proximate the bottom of the page, the "lower" levels and elevations then illustrated proximate the top of the page, and the greatest "depths" extending a greatest vertical distance upward.

As used herein, the terms "comprising," "including," "having," and grammatical equivalents thereof are inclusive, open-ended terms that do not exclude additional, unrecited elements or method steps. These terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a material (e.g., composition) described as "comprising," "including," and/or "having" a species may be a material that, in some embodiments, includes additional species as well and/or a material that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, an "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced material, structure, assembly, or apparatus so as to facilitate a referenced operation or property of the referenced material, structure, assembly, or apparatus in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded; surfaces and features illustrated to be vertical may be non-vertical, bent, and/or bowed; and/or structures illustrated with consistent transverse widths and/or lengths throughout the height of the structure may taper in transverse width and/or length. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1, illustrated is a microelectronic device structure 100 that includes a stack 102 (which may otherwise be referred to herein as a "stack structure" or as a "tiered stack") of vertically alternating (e.g., vertically interleaved) insulative structures 104 and conductive structures 106 arranged in tiers 108. Each tier 108 may include at least one insulative structure 104 and at least one conductive structure 106. In some embodiments, each tier 108 includes a single one of the insulative structures 104 and a single one of the conductive structures 106.

While FIG. 1 illustrates about sixty (60) tiers 108 (e.g., sixty (60) conductive structures 106) in the stack 102, the disclosure is not so limiting. For example, a microelectronic device structure, in accordance with embodiments of the disclosure, may include a different quantity of the tiers 108 (e.g., and of the conductive structures 106) in the stack 102. In some embodiments, the stack 102 includes one-hundred twenty-eight of the tiers 108 (and of the conductive structures 106). The number (e.g., quantity) of the tiers 108—and therefore of the conductive structures 106—of the stack 102 may be within a range of from thirty-two to three-hundred or more.

The conductive structures 106 may be formed of and include (e.g., each be formed of and include) one or more conductive materials, such as one or more of: at least one metal (e.g., one or more of tungsten, titanium, nickel, platinum, rhodium, ruthenium, iridium, aluminum, copper, molybdenum, silver, gold), at least one alloy (e.g., an alloy of one or more of the aforementioned metals), at least one metal-containing material that includes one or more of the aforementioned metals (e.g., metal nitrides, metal silicides, metal carbides, metal oxides, such as a material including one or more of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof), at least one conductively-doped semiconductor material (e.g., conductively-doped silicon, conductively-doped germanium, conductively-doped silicon germanium), polysilicon, and at least one other material exhibiting electrical conductivity. In some embodiments, the conductive structures 106 include at least one of the aforementioned conductive materials along with at least one additional of the aforementioned conductive materials formed as a liner. Some or all of the conductive structures 106 may have the same (e.g., consistent) or different thicknesses (e.g., heights) as one another.

The insulative structures 104 may be formed of and include (e.g., each be formed of and include) at least one insulative material, such as a dielectric oxide material (e.g., silicon dioxide). In this and other embodiments described herein, the insulative material of the insulative structures 104 may be substantially the same as or different than other insulative material(s) of the microelectronic device structure 100. Some or all of the insulative structures 104 may have the same (e.g., consistent) or different thicknesses (e.g., heights) as one another. In some embodiments, some of the insulative structures 104 (e.g., an uppermost, a lowest, and/or intermediate insulative structures 104) are relatively thicker than others of the insulative structures 104 in the stack 102.

The stack 102 may be provided on or over a base structure 110, which may be formed of and include, for example, one or more semiconductor materials (e.g., polycrystalline silicon (polysilicon)) doped with one or more P-type conductivity chemical species (e.g., one or more of boron, aluminum, and gallium) or one or more N-type conductivity chemical species (e.g., one or more of arsenic, phosphorous, and antimony) to provide a source/drain region of the microelectronic device structure 100.

In addition to the semiconductor materials and/or source/drain region, the base structure 110 may include other base material(s) or structure(s), such as conductive regions for making electrical connections with other conductive structures of the device that includes the microelectronic device structure 100. In some such embodiments, CMOS (complementary metal-oxide-semiconductor) circuitry is included, within the base structure 110, in a CMOS region below the source/drain region, which CMOS region may be characterized as a so-called "CMOS under Array" ("CuA") region.

A series of slits or other elongate structures may extend through the stack 102 to divide the stack 102 into a series of blocks 112 that extend in the lateral direction (e.g., with a greater dimension (e.g., width) in the "X"-axis direction than a dimension (e.g., length) in the "Y"-axis direction). For example, a pair of slits may be formed, parallel to the "X"-axis of FIG. 1, to define the front and rear of the block 112 of the microelectronic device structure 100 illustrated in FIG. 1. A longitudinally forward and/or rearward neighboring block, to the block 112 of FIG. 1, may be similarly structured to the block 112 of FIG. 1 such that the illustration of FIG. 1 may represent such neighboring block(s) as well. Alternatively, such neighboring blocks may have structures substantially mirrored to that of the block 112 of FIG. 1, reflected about the slit that separates the blocks 112 from one another.

Other portions of the microelectronic device structure 100 (e.g., portions horizontally disposed relative to the portions illustrated in, e.g., FIG. 1) may include array(s) of pillars (e.g., including channel material and memory material) extending through the stack 102 and to and/or into the base structure 110 (e.g., to and/or into a source/drain region). The pillars may effectuate the formation of strings of memory cells of a memory device (e.g., a memory device including any of the microelectronic device structures described or illustrated herein). The conductive structures 106 of the tiers 108 may be coupled to, or may form control gates of, the memory cells effectuated by the pillars. For example, each conductive structure 106 may be coupled to an individual memory cell of a particular string (e.g., effectuated by a particular pillar) of memory cells.

To facilitate electrical communication to particular selected conductive structures 106 within the stack 102, conductive contact structures extend to (or from) and physically contact the conductive structures 106 of the tiers 108. Each such conductive contact structure is positioned to physically contact a particular one of the conductive structures 106 at a step 114 (e.g., a landing area provided by an exposed upper (e.g., horizontal) surface portion of one of the conductive structures 106). These conductive contact structures physically contacting the steps 114 may be referred to herein as "step contacts 116."

To provide the steps 114 of the conductive structures 106, the stack 102 is patterned (e.g., etched) to expose, at various levels, one or more upper (e.g., horizontal) surface area portion of each conductive structure 106. That is, the tiers 108 are selectively patterned to remove portions of otherwise-overlying tiers 108 to leave exposed at least one upper surface area of the conductive structure 106 of the next lower tier 108. Each exposed area provides one of the steps 114 for the respective tier 108 (and conductive structure 106).

Because individual conductive structures 106 in the stack 102 may occupy different elevations of the stack 102 (also referred to herein as different "tier elevations"), the steps 114 are formed at the various elevations of the conductive structures 106, and the step contacts 116 extend downward to physically contact (e.g., "land on") respective steps 114. The height of an individual step contact 116 may be tailored according to the depth (e.g., elevation) of its respective step 114. The step contacts 116 extending to steps 114 in the highest elevations of the stack 102 may be generally shorter than the step contacts 116 that extend to steps 114 in the lowest elevations of (deepest into) the stack 102. The microelectronic device structure 100 may include, in each respective block 112, at least one step contact 116 per step 114 and, therefore, at least one step contact 116 per tier 108 (e.g., and therefore per conductive structure 106) in the stack 102.

The tiers 108 of the stack 102 are patterned so that at least some of the tiers 108 (and, therefore, at least some of the conductive structures 106) of the stack 102 provide multiple steps 114 or relatively-wider and/or relatively-longer steps 114, each for landing at least one respective step contact 116. Multiple step contacts 116 extend to each such tier 108 (and its conductive structure 106).

In some embodiments, the tiers 108 connected with multiple step contacts 116 (and, in some embodiments, having multiple steps 114) may be the deepest (e.g., lowest) tiers 108 of the stack 102, where the step contacts 116 extend relatively greater vertical distances and therefore have relatively greater heights and higher aspect ratios compared to the step contacts 116 that extend to the higher-elevated steps 114. Reliable fabrication of such high-aspect-ratio step contacts 116 tends to be particularly challenging, as discussed further below. Therefore, should one such step contact 116 be errantly fabricated in a manner that results in the step contact 116 not physically contacting a respective conductive structure 106, the other(s) of the multiple step contacts 116 may nonetheless provide electrical communication to the conductive structure 106, e.g., via physical connection to the other(s) of the multiple steps 114 of the tier 108 (or to another portion of the relatively-wider and/or relatively-longer step 114 of the tier 108).

The steps 114 may be grouped, e.g., according to depth, in staircases having a series of the steps 114. For example, one series of steps 114 may be formed at successively increasing tier 108 (and conductive structure 106) depths (e.g., decreasing tier 108 elevations) to define a descending staircase 118 having generally negative slope. Elsewhere, another series of steps 114 may be formed at successively decreasing tier 108 (and conductive structure 106) depths (e.g., increasing tier 108 elevations) to define an ascending staircase 120 having generally positive slope. In some embodiments, the elevation difference between neighboring steps 114 of the staircases (e.g., one of the descending staircases 118, one of the ascending staircases 120) is a "rise" or "fall" of the height of one tier 108.

The staircases (e.g., the descending staircases 118 and the ascending staircases 120) may be grouped in so-called "stadiums" 122, which may be arranged in a series (e.g., first stadium 124, second stadium 126, third stadium 128, fourth stadium 130) across a width of the block 112 of the microelectronic device structure 100. The microelectronic device structure 100 may include as many stadiums 122 within a respective block 112 as necessary to include at least one step 114 per tier 108 (and per conductive structure 106) of the stack 102.

Neighboring stadiums 122 may be spaced from one another by a so-called "crest" 132 of the stack 102. The crests 132 may be formed by areas of the stack 102 where the tiers 108 have not been patterned. The crests 132 may, therefore, extend an entire height of the stack 102.

Another non-patterned portion of the stack 102 forms a so-called "bridge" 134 that extends a width of the block 112. The bridge 134 may border one of the slits that define the block 112. Via the bridge 134, distal portions of a given conductive structure 106 of a respective tier 108 are part of a continuous, single conductive structure 106 at that tier 108 elevation. Therefore, multiple steps 114 provided by a given tier 108 (e.g., a given conductive structure 106 thereof) remain in electrical communication with one another, regardless of where (e.g., laterally or longitudinally) along the block 112 each of the multiple steps 114 are provided for that tier 108 (e.g., for that conductive structure 106).

In some embodiments, such as with the microelectronic device structure 100 of FIG. 1, the tiers 108 that include multiple steps 114, and that are associated with multiple step contacts 116, provide the multiple steps 114 within the staircases of a single stadium 122, referred to herein as a "multi-step-per-tier stadium" 136. At least one multi-step-per-tier stadium 136 within an individual block 112 of the stack 102 may be a deepest stadium 122 of the stack 102. Thus, in the multi-step-per-tier stadiums 136, each of at least some of the "stepped tiers" 138 of the stadium 122 includes multiple steps 114.

As used herein, a "stepped tier" means and refers to a tier 108 of the stack 102 that defines at least one step 114 (e.g., at least one landing area for the conductive structure 106 of the tier 108).

To provide the multiple steps 114 per stepped tier 138 in the multi-step-per-tier stadium 136, the tiers 108 may be patterned to define a stadium profile having multiple staircases, at least a portion of each of which being defined in the same elevations (e.g., the same tier 108 levels of the stack 102) as one another. Therefore, each stepped tier 138 providing multiple steps includes one step 114 in one staircase and one or more additional steps 114 in one or more of the additional staircase(s) of the multi-step-per-tier stadium 136.

The portion of FIG. 1 indicated by box 140 illustrates a staircase profile for the multi-step-per-tier stadium 136. Alternative staircase profiles for the multi-step-per-tier stadiums 136 are illustrated in each of FIG. 2A through FIG. 2D, and any one of which may replace that which is illustrated in either or both boxes 140 of FIG. 1 (or in any other box 140 of microelectronic device structures illustrated in the figures).

Figure 2A:
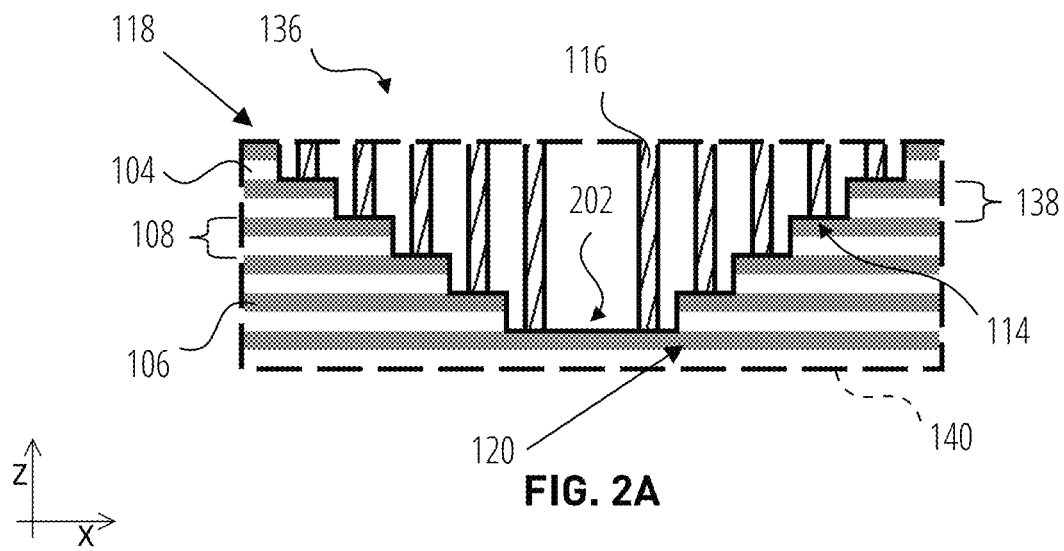
FIG. 2A is an enlarged, schematic, cross-sectional, elevational view of a staircase profile of a multi-step-per-tier stadium, which illustrated portion may replace any or all of the portion(s) of FIG. 1 indicated by box 140, according to embodiments of the disclosure, wherein a descending staircase descends toward an ascending staircase, the two staircases sharing a common lowest step.
Figure 2B:
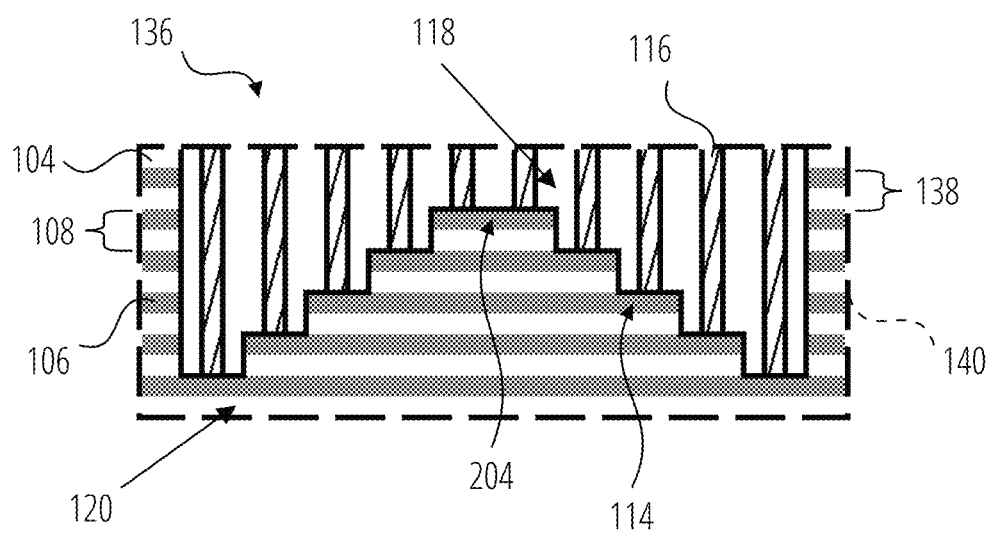
FIG. 2B is an enlarged, schematic, cross-sectional, elevational view of a staircase profile of a multi-step-per-tier stadium, which illustrated portion may replace any or all of the portion(s) of FIG. 1 indicated by box 140, according to embodiments of the disclosure, wherein an ascending staircase ascends toward a descending staircase, the two staircases sharing a common highest step.
Figure 2C:
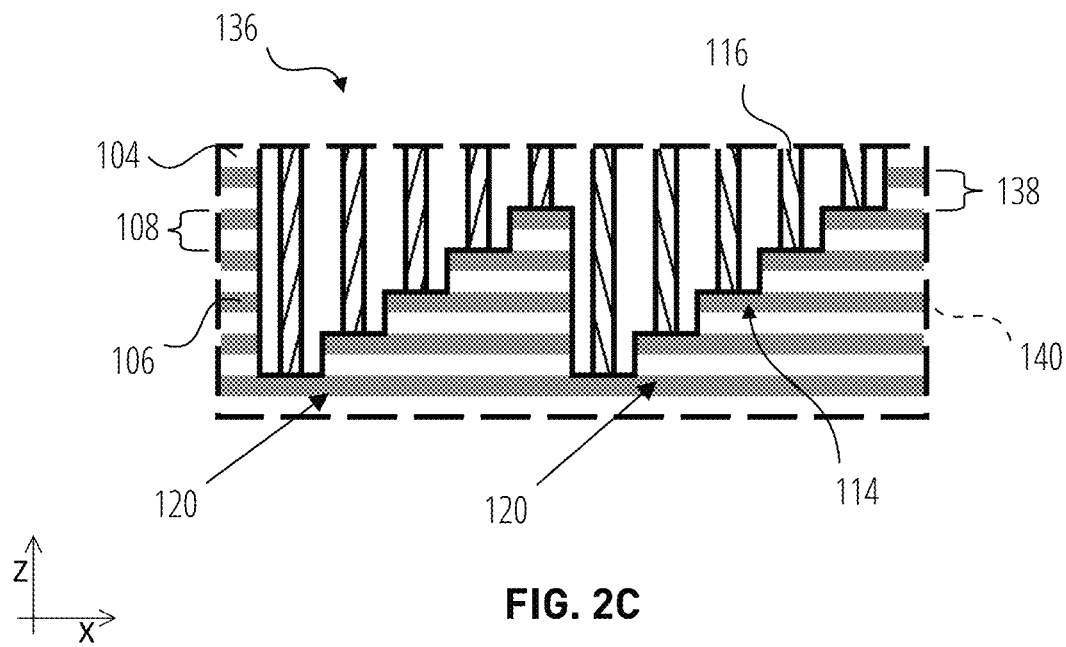
FIG. 2C is an enlarged, schematic, cross-sectional, elevational view of a staircase profile of a multi-step-per-tier stadium, which illustrated portion may replace any or all of the portion(s) of FIG. 1 indicated by box 140, according to embodiments of the disclosure, wherein the staircase profile includes a pair of ascending staircases.
Figure 2D:
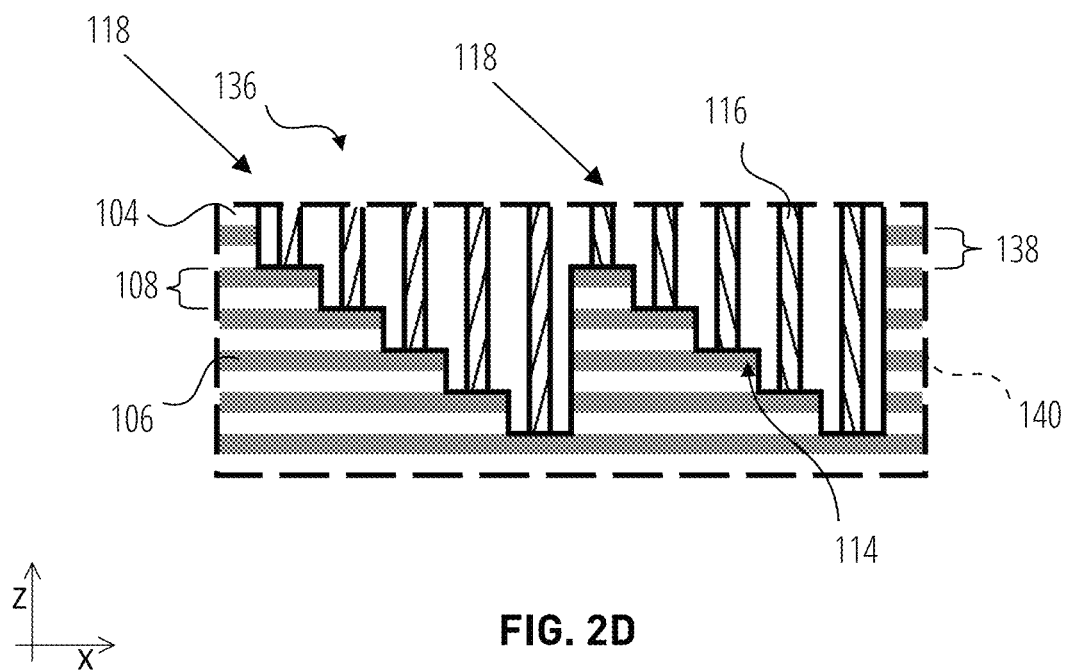
FIG. 2D is an enlarged, schematic, cross-sectional, elevational view of a staircase profile of a multi-step-per-tier stadium, which illustrated portion may replace any or all of the portion(s) of FIG. 1 indicated by box 140, according to embodiments of the disclosure, wherein the staircase profile includes a pair of descending staircases.

In some embodiments, one or more pairs of opposing staircases provide the multiple staircases to provide the multiple steps 114 per stepped tier 138 of the multi-step-per-tier stadium 136, such as the descending staircase 118 and the ascending staircase 120 illustrated in box 140 of FIG. 1, FIG. 2A, and FIG. 2B. As illustrated in these figures, the profile and structure of the descending staircase 118 may substantially mirror the profile and structure of the ascending staircase 120. Thus, each stepped tier 138 includes one step 114 in the descending staircase 118 and one step 114 in the ascending staircase 120.

With regard to box 140 of FIG. 1, a staircase landing 142, to which the descending staircase 118 descends and from which the ascending staircase 120 ascends, may be provided by an upper surface of one of the insulative structures 104, exposed through an opening in the lowest conductive structure 106 of the stepped tiers 138 of the respective multi-step-per-tier stadium 136. Therefore, the multiple steps 114 of the lowest stepped tier 138 of the multi-step-per-tier stadium 136 may be to the left and right lateral sides of the staircase landing 142.

With regard to box 140 of FIG. 2A, in some embodiments the lowest stepped tier 138 of a respective one of the multi-step-per-tier stadiums 136 may be a nonpatterned conductive structure 106, such that the lowest step 114 of each opposing staircases (e.g., the ascending staircase 120, the descending staircase 118) is a shared, single lowest step 202 (e.g., a single exposed upper surface portion of one of the conductive structures 106) to which extend multiple (e.g., two) step contacts 116, rather than multiple distinct steps 114 as in the box 140 area of FIG. 1. Therefore, the lowest step 202 provides the lowest step 114 of the descending staircase 118 and also the lowest step 114 of the ascending staircase 120, and the multiple step contacts 116 extend to this single lowest step 114. The lowest step 114 may be relatively wider than the individual steps 114 in the above tier 108 elevations of the descending staircase 118 and the ascending staircase 120.

While box 140 of FIG. 1 and FIG. 2A illustrate the descending staircase 118 of each multi-step-per-tier stadium 136 as descending toward the ascending staircase 120 of that multi-step-per-tier stadium 136, providing a "V"-shaped staircase profile across the width of the multi-step-per-tier stadium 136, in other embodiments, such as that illustrated in FIG. 2B, the ascending staircase 120 ascends toward the descending staircase 118, providing an inverted "V"-shaped staircase profile. A single highest step 204 (e.g., a single exposed upper surface portion of one of the conductive structures 106) may provide both a highest step 114 of the ascending staircase 120 and the highest step 114 of the descending staircase 118. Multiple step contacts 116 may extend to this single, highest step 114, which highest step 114 may be relatively wider than the individual steps 114 in the lower tier 108 elevations of the ascending staircase 120 and the descending staircase 118.

While box 140 of FIG. 1, FIG. 2A, and FIG. 2B illustrate the multiple staircases configured as opposing pairs of staircases (e.g., the descending staircase 118 and the ascending staircase 120) with substantially laterally mirrored structures and profiles, in other embodiments, the multiple staircases of the multi-step-per-tier stadium 136 may share substantially the same structure without lateral mirroring. For example, and with reference to FIG. 2C, the multi-step-per-tier stadium 136 may include multiple ascending staircases 120, each with substantially the same elevational profile. As another example, and with reference to FIG. 2D, the multi-step-per-tier stadium 136 may include multiple descending staircases 118, each with substantially the same elevational profile.

Accordingly, the at least one multi-step-per-tier stadium 136 of the microelectronic device structure 100 is configured with a staircase profile providing multiple steps 114 per at least some of the stepped tiers 138, such as with multiple staircases formed through the same tier 108 elevations as one another. At least one step contact 116 extends to each step 114 of the multiple steps 114 in the multi-step-per-tier stadium 136. Therefore, should one step contact 116 happen to fail (e.g., due to fabrication errors or other reason(s)) to provide electrical communication to its respective step 114 and stepped tier 138, at least one other step contact 116 is associated with the same stepped tier 138 to provide the electrical communication to the conductive structure 106 (e.g., word line) of the stepped tier 138 via the same or an additional step 114.

With returned reference to FIG. 1, while at least one stadium 122 of the block 112 is configured as the multi-step-per-tier stadium 136, one or more other stadiums 122 of the block 112 may be configured with only a single step 114 per stepped tier 138. Such stadiums 122 may be referred to herein as "single-step-per-tier stadiums" 144.

To provide a single step 114 per stepped tier 138 in the single-step-per-tier stadium 144, the single-step-per-tier stadium 144 may include one or more staircases that, together, provide steps 114 each at a different tier 108 elevation. The portion of FIG. 1 indicated by box 146 illustrates a staircase profile for the single-step-per-tier stadium 144. Alternative staircase profiles for the single-step-per-tier stadium 144 are illustrated in each of FIG. 3A through FIG. 3E, and any one of which may replace that which is illustrated in either or both of boxes 146 of FIG. 1 (or in any other box 146 of microelectronic device structures illustrated in the figures).

In some embodiments, one or more pairs of opposing and vertically-offset staircases may provide the multiple staircases that together define the single step 114 per stepped tier 138 of the single-step-per-tier stadium 144, such as the descending staircase 118 and the ascending staircase 120 illustrated in the box 140 of any of FIG. 1, FIG. 3A, FIG. 3B, and FIG. 3C. Thus, one staircase is formed in tier 108 elevations above the tier 108 elevations in which at least one other staircase is formed. An offset 148 of multiple tiers 108 vertically separates the final step 114 of one staircase from the beginning step 114 of the opposing staircase. The offset 148 may be at least the number of tiers 108 (e.g., the quantity of stepped tiers 138) in which lower of the pair of opposing, vertically-offset staircases is formed.

Figure 3A:
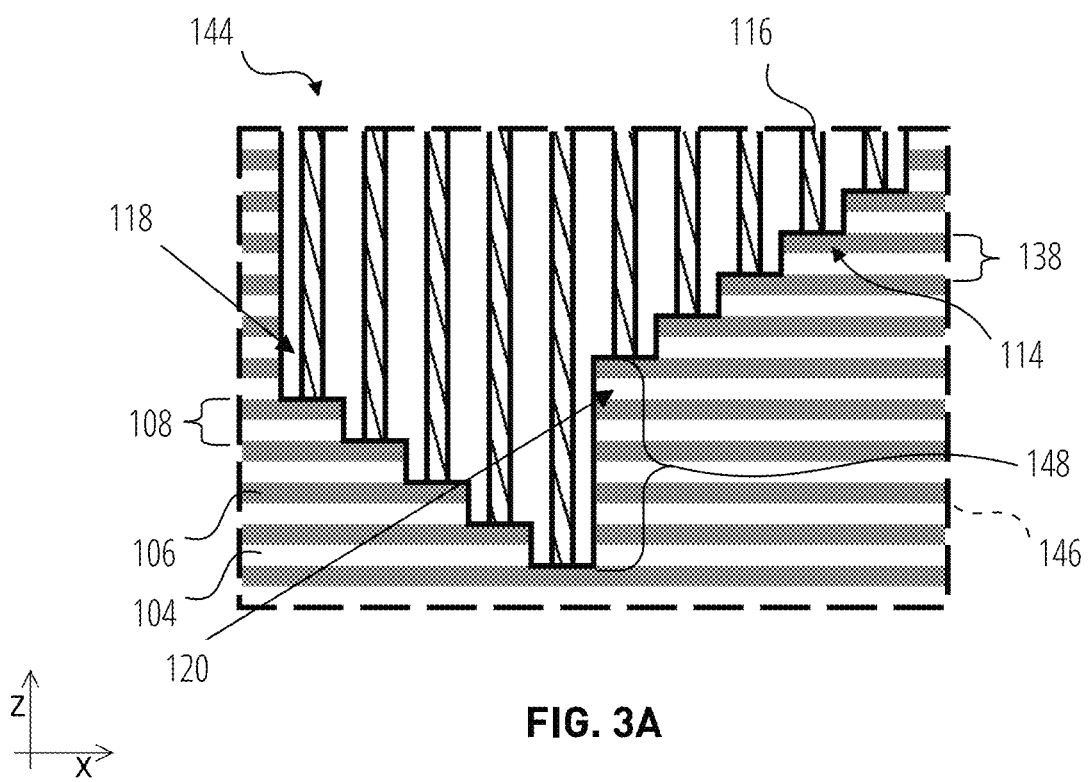
FIG. 3A is an enlarged, schematic, cross-sectional, elevational view of a staircase profile of a single-step-per-tier stadium, which illustrated portion may replace any or all of the portion(s) of FIG. 1 indicated by box 146, according to embodiments of the disclosure, wherein a lowest step of a descending staircase is vertically offset below a lowest step of an ascending staircase.
Figure 3B:
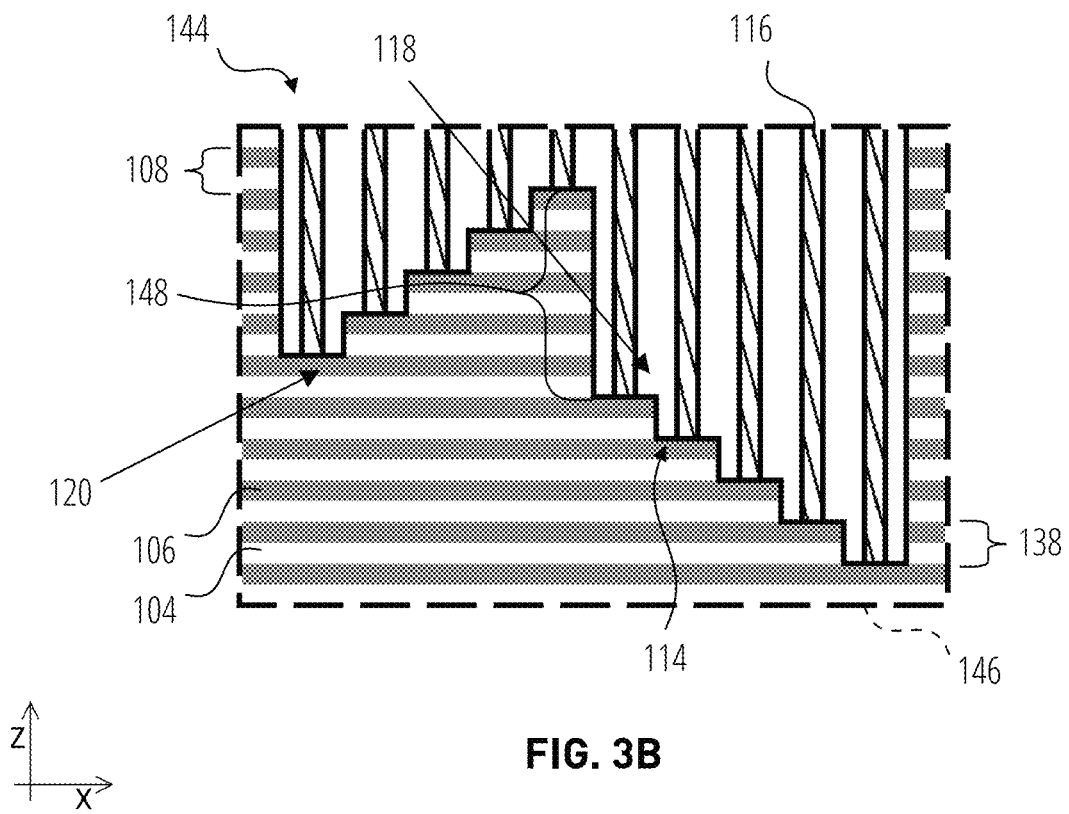
FIG. 3B is an enlarged, schematic, cross-sectional, elevational view of a staircase profile of a single-step-per-tier stadium, which illustrated portion may replace any or all of the portion(s) of FIG. 1 indicated by box 146, according to embodiments of the disclosure, wherein a highest step of an ascending staircase is vertically offset above a highest step of a descending staircase.

In some embodiments—such as those illustrated in box 146 of FIG. 1 and FIG. 3A—the descending staircase 118 descends toward the offset 148 and the ascending staircase 120, and the ascending staircase 120 ascends away from the offset 148 and the descending staircase 118. Thus, the opposing, vertically-offset staircases are generally angled toward the center of the single-step-per-tier stadium 144. In other embodiments—such as those illustrated in box 146 of FIG. 3B and FIG. 3C—the ascending staircase 120 ascends toward the offset 148 and the descending staircase 118, and the descending staircase 118 descends away from the offset 148 and the ascending staircase 120. Thus, the opposing, vertically-offset staircases are generally angled away from the center of the single-step-per-tier stadium 144.

Figure 3C:
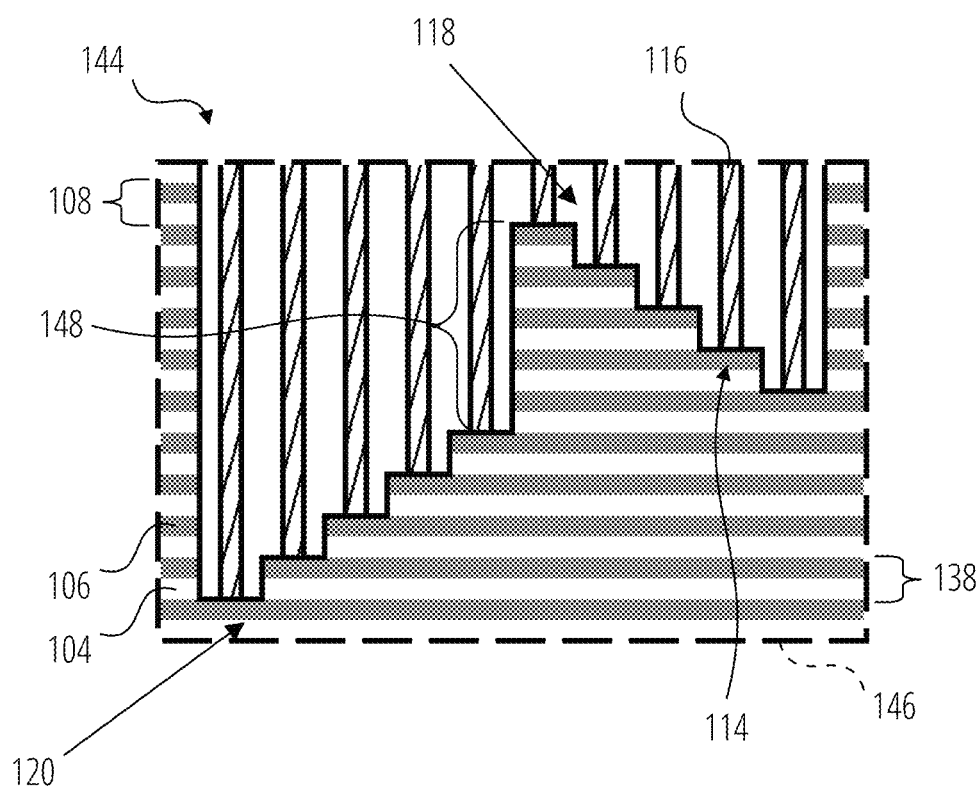
FIG. 3C is an enlarged, schematic, cross-sectional, elevational view of a staircase profile of a single-step-per-tier stadium, which illustrated portion may replace any or all of the portion(s) of FIG. 1 indicated by box 146, according to embodiments of the disclosure, wherein a highest step of an ascending staircase is vertically offset below a highest step of a descending staircase.
Figure 3D:
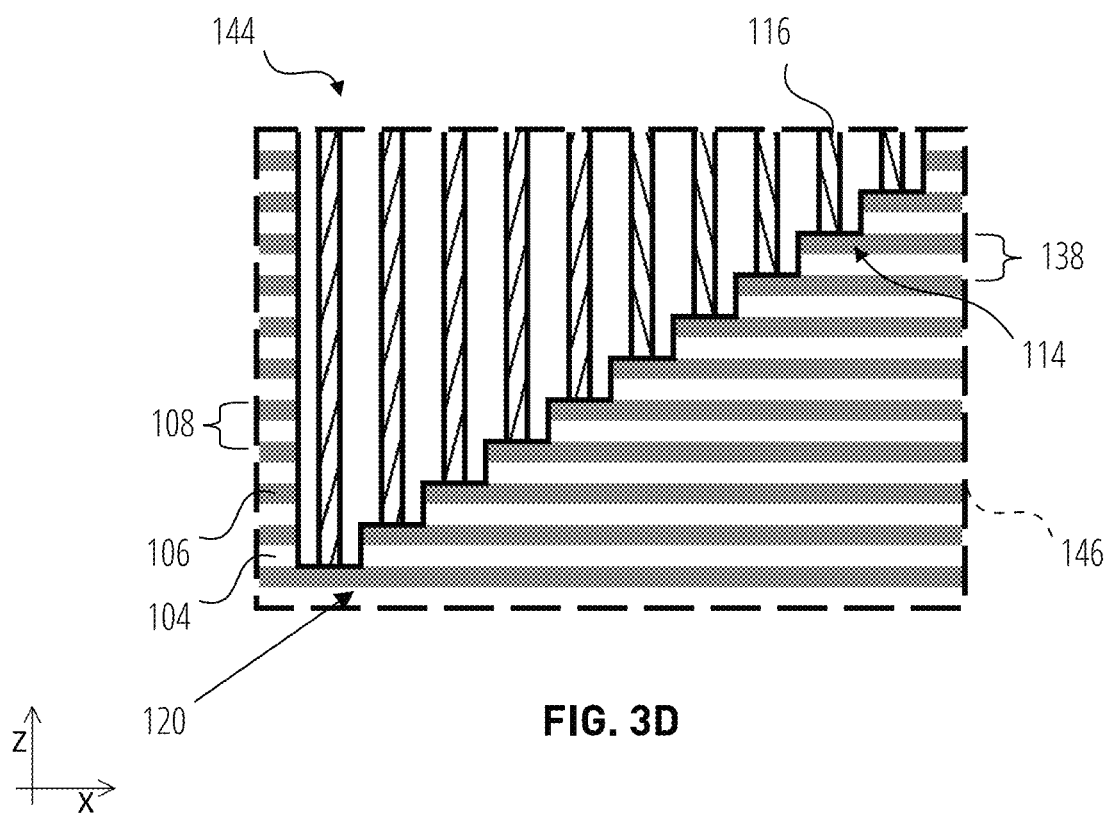
FIG. 3D is an enlarged, schematic, cross-sectional, elevational view of a staircase profile of a single-step-per-tier stadium, which illustrated portion may replace any or all of the portion(s) of FIG. 1 indicated by box 146, according to embodiments of the disclosure, wherein an ascending staircase ascends across a whole width of the stadium.
Figure 3E:
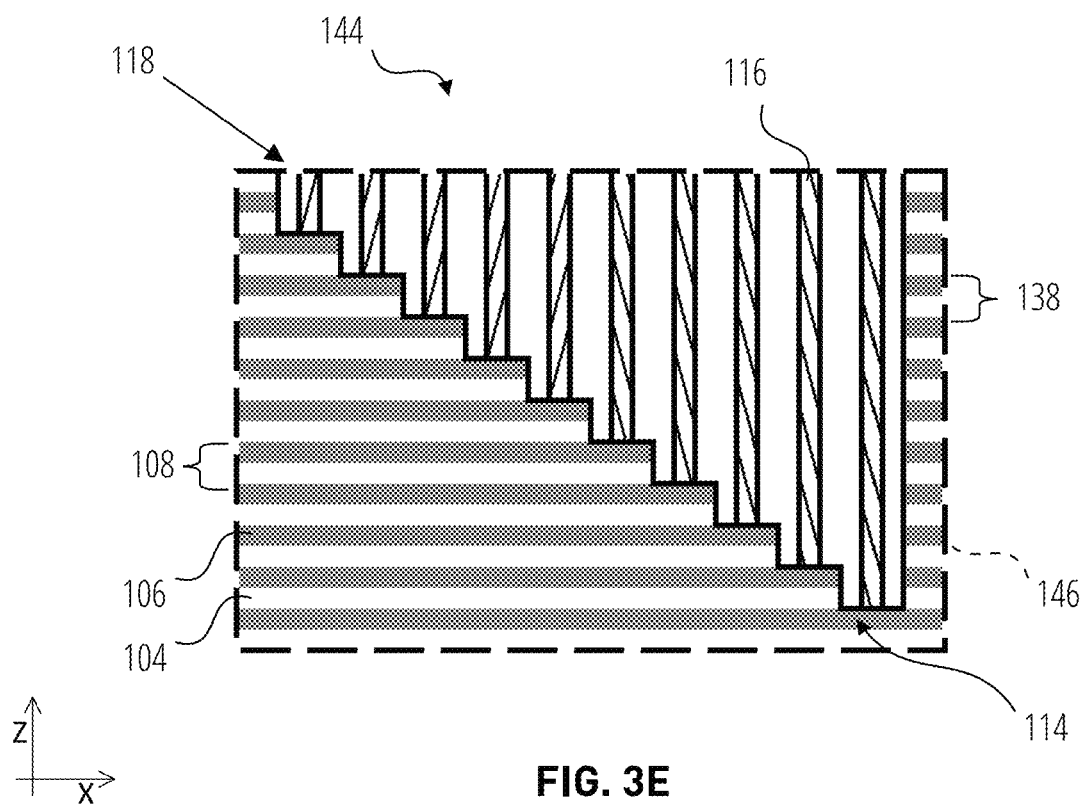
FIG. 3E is an enlarged, schematic, cross-sectional, elevational view of a staircase profile of a single-step-per-tier stadium, which illustrated portion may replace any or all of the portion(s) of FIG. 1 indicated by box 146, according to embodiments of the disclosure, wherein a descending staircase descends across a whole width of the stadium.

In some embodiments—such as those illustrated in box 146 of FIG. 1 and FIG. 3C—the descending staircase 118 is formed in tier 108 elevations above those in which the ascending staircase 120 is formed. In other embodiments—such as those illustrated in box 146 of FIG. 3A and FIG. 3B—the ascending staircase 120 is formed in tier 108 elevations above those in which the descending staircase 118 is formed.

In some embodiments—such as that illustrated in box 146 of FIG. 1—the final (e.g., lowest) step 114 of the descending staircase 118 is vertically spaced, by the offset 148, above the beginning (e.g., lowest) step 114 of the ascending staircase 120. In some embodiments—such as that illustrated in box 146 of FIG. 3A—the final (e.g., lowest) step 114 of the descending staircase 118 is vertically spaced, by the offset 148, below the beginning (e.g., lowest) step 114 of the ascending staircase 120. In some embodiments—such as that illustrated in box 146 of FIG. 3B—the final (e.g., highest) step 114 of the ascending staircase 120 is vertically spaced, by the offset 148, above the beginning (e.g., highest) step 114 of the descending staircase 118. In some embodiments—such as that illustrated in box 146 of FIG. 3C—the final (e.g., highest) step 114 of the ascending staircase 120 is vertically spaced, by the offset 148, below the beginning (e.g., highest) step 114 of the descending staircase 118.

While box 146 of FIG. 1 and FIG. 3A through FIG. 3C illustrate multiple staircases configured as opposing, vertically-offset pairs with the descending staircase 118 and the ascending staircase 120, in other embodiments, a single staircase may extend through all tier 108 elevations of the stepped tiers 138 to provide the single step 114 per stepped tier 138 in the single-step-per-tier stadiums 144. For example, and with reference to FIG. 3D, the single-step-per-tier stadium 144 may include a single ascending staircase 120. As another example, and with reference to FIG. 3E, the single-step-per-tier stadium 144 may include a single descending staircase 118.

Accordingly, the at least one single-step-per-tier stadium 144 of the microelectronic device structure 100 is configured with a staircase profile providing a single step 114 per stepped tier 138, such as with at least one staircase providing steps 114 at different tier 108 elevations of the single-step-per-tier stadium 144. A single step contact 116 extends to each respective one of the steps 114.

With continued reference to FIG. 1, in embodiments in which the microelectronic device structure 100 includes one or more single-step-per-tier stadiums 144, the single-step-per-tier stadiums 144 may be formed in the relatively higher elevations of the stack 102, such as where the heights of the step contacts 116 are relatively shorter than the heights of the step contacts 116 that extend to the relatively lower elevations of the stack 102. The relatively-shorter step contacts 116 may experience relatively fewer fabrication challenges, compared to fabrication challenges of the relatively-taller step contacts 116, and may, therefore, be less likely to experience fabrication errors that would cause electrical communication failures with the respective conductive structures 106 (e.g., word lines) in the upper elevations of the stack 102.

The stadiums 122 of the microelectronic device structure 100 may be arranged in a series across the width of the block 112, and the staircase profiles of the stadiums 122 may be formed to as to provide at least one step 114 per tier 108 (e.g., per conductive structure 106) of the stack 102. In some embodiments, such as that illustrated in FIG. 1, the depths of the stadiums 122 may increase with increased lateral distance across the block 112. Therefore, the steps 114 of a first stadium 124 may be in tier 108 elevations above the steps 114 of a second stadium 126, which may be in tier 108 elevations above the steps 114 of a third stadium 128, which may be in tier 108 elevations above the steps 114 of a fourth stadium 130, etc. In other embodiments, the stadiums 122 may not be arranged in relatively increasing or decreasing depths across the series of the block 112. For example, one stadium 122 may be relatively deeper than laterally neighboring stadiums 122, and/or one stadium 122 may be relatively shallower than laterally neighboring stadiums 122.

In some embodiments, regardless of the order and sequence of the various stadium 122 depths, one or more of the relatively deeper stadiums 122 (e.g., the third stadium 128 and the fourth stadium 130 of FIG. 1) may be configured as the multi-step-per-tier stadiums 136, while one or more relatively shallower stadiums 122 (e.g., the first stadium 124 and the second stadium 126 of FIG. 1) may be configured as the single-step-per-tier stadiums 144. The staircase profiles of each multi-step-per-tier stadium 136 of the block 112 may be the same or different as one another, and/or the staircase profiles of each single-step-per-tier stadium 144, if any, of the block 112 may be the same or different as one another.

While FIG. 1 illustrates a series of four stadiums 122, the disclosure is not so limited. The stadiums 122 of the series of the block 112 may include additional stadiums 122, e.g., in an intermediate region 150 or in regions laterally adjacent any of the stadiums 122 illustrated in FIG. 1. The additional stadiums 122 may be either multi-step-per-tier stadiums 136 (e.g., with a staircase profile of any of box 140 of FIG. 1, FIG. 2A, FIG. 2B, FIG. 2C, and FIG. 2D or any other staircase profile(s) configured for multiple step contacts 116 per stepped tier 138) or single-step-per-tier stadiums 144 (e.g., with a staircase profile of any of box 146 of FIG. 1, FIG. 3A, FIG. 3B, FIG. 3C, FIG. 3D, and FIG. 3E).

Accordingly, disclosed is a microelectronic device. The microelectronic device comprises a stack structure comprising a vertically alternating sequence of insulative structures and conductive structures arranged in tiers. Each of the tiers comprises at least one of the conductive structures and at least one of the insulative structures. The microelectronic device also comprises stadiums within the stack structure. At least one of the stadiums comprises two staircases having steps provided by a group of the conductive structures. Step contacts extend to the steps of the two staircases of the at least one of the stadiums. Each conductive structure of the group of conductive structures has more than one of the step contacts in contact therewith at at least one of the steps of the two staircases.

Figure 4:
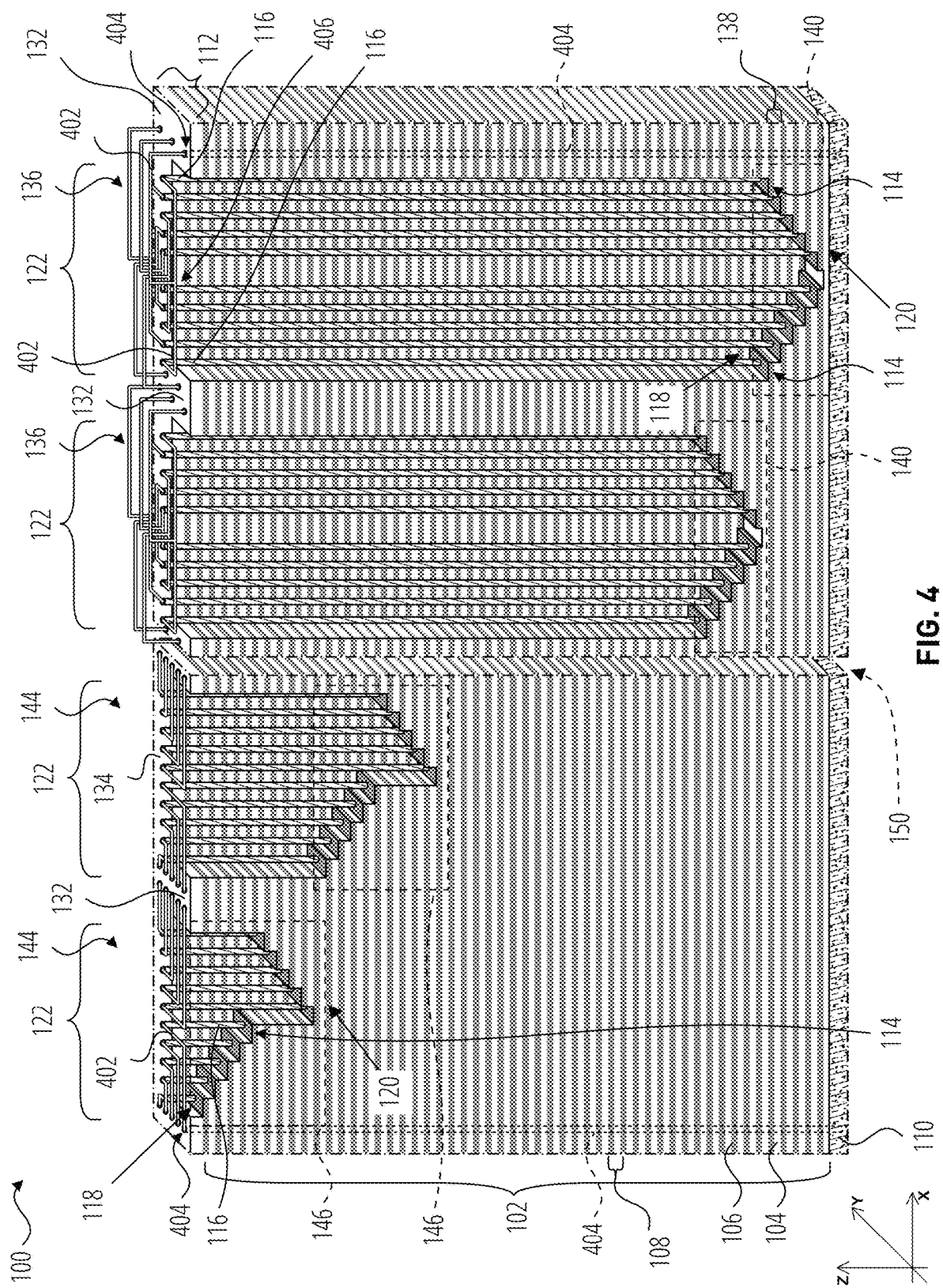
FIG. 4 is a schematic, cross-sectional, perspective view of the microelectronic device structure of FIG. 1, further illustrating routing lines configured for sharing electrical communication between through-stack contacts, step contacts, and the conductive structures to which the step contacts extend, in accordance with embodiments of the disclosure.

With reference to FIG. 4, illustrated is the microelectronic device structure 100 of FIG. 1 and further illustrating routing lines 402 formed to electrically connect the step contacts 116 with additional conductive contact structures (referred to herein as "through-stack contacts" 404), which may be disposed within the horizontal area of the crests 132 of the stack 102. The through-stack contacts 404 may extend through the height of the stack 102 to the base structure 110 (e.g., to or through a source/drain region in the base structure 110, e.g., to additional routing lines or other conductive features below the stack 102).

For each stepped tier 138 of the single-step-per-tier stadiums 144, one routing line 402 may extend between one through-stack contact 404 and one step contact 116. Therefore, the one (e.g., single) routing line 402 may electrically connect the one (e.g., single) through-stack contact 404, the one (e.g., single) step contact 116, and the one (e.g., single) step 114 (and, therefore, the one conductive structure 106 that provides the step 114) to which the one step contact 116 extends. Thus, the one conductive structure 106 may be in shared electrical communication with the one through-stack contact 404 via a single (e.g., only one) electrical communication route (e.g., conductive path).

For each stepped tier 138 of the multi-step-per-tier stadiums 136, at least one routing line 402 extends between one through-stack contact 404 and each of the multiple step contacts 116 that extend to the conductive structure 106 (e.g., to multiple steps 114 of the one conductive structure 106) of the stepped tier 138. Thus, the one conductive structure 106 is in electrical communication with the one through-stack contact 404 through multiple electrical communication routes (e.g., multiple conductive paths). In some embodiments, one or more junctions 406 facilitate the electrical communication between the multiple step contacts 116 and the single through-stack contact 404. For example, one routing line 402 may extend between one of the multiple step contacts 116 and the junction 406, one additional routing line 402 may extend between one additional of the multiple step contacts 116 and the junction 406, and one further routing line 402 may extend between the junction 406 and the one through-stack contact 404. However, the disclosure is not limited to this arrangement, and the routing lines 402 connecting multiple step contacts 116 to a respective single through-stack contact 404 may be otherwise configured.

Figure 5:
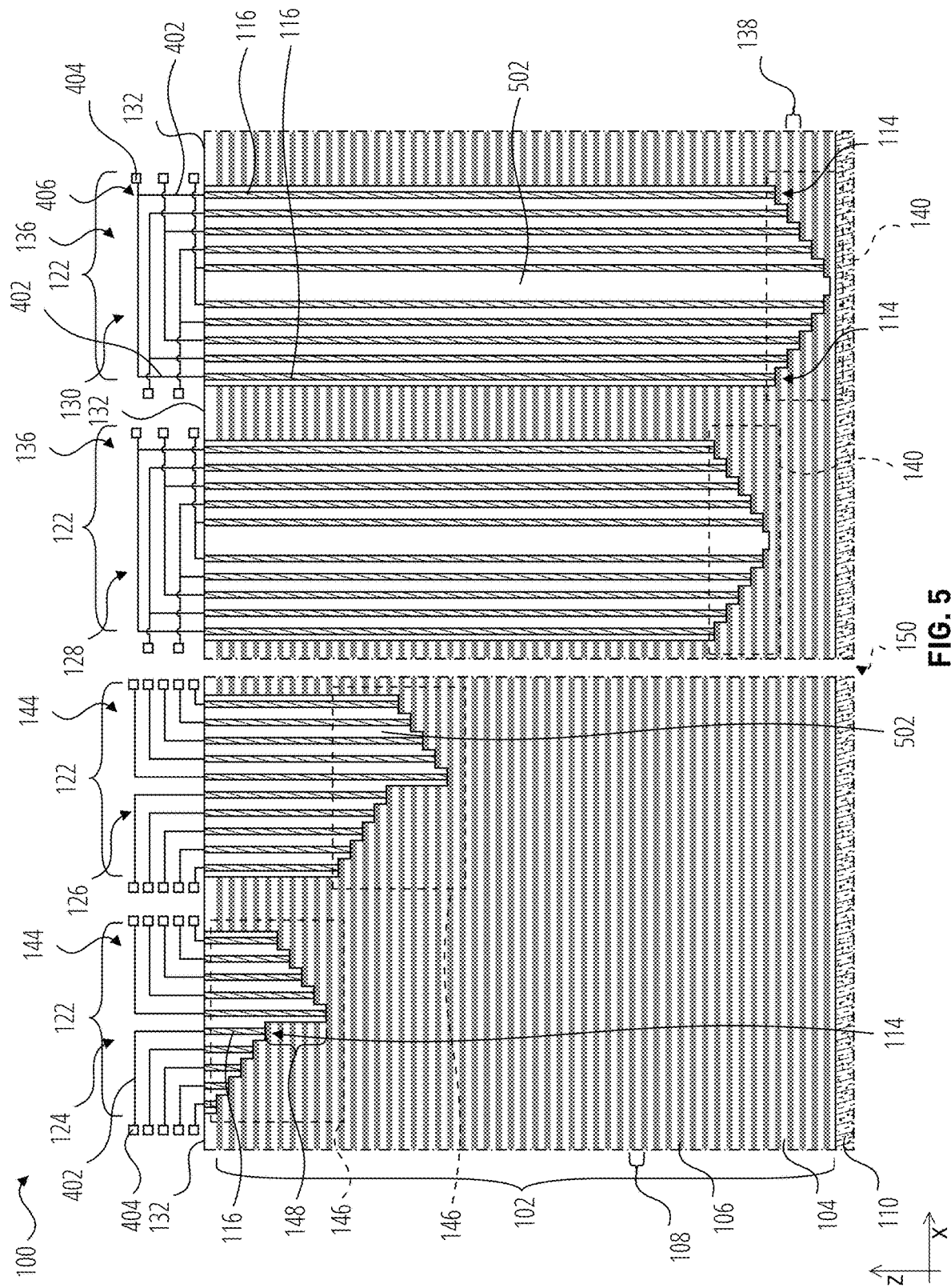
FIG. 5 is a schematic, cross-sectional, elevational view of the microelectronic device structure of FIG. 1 and FIG. 4, schematically illustrating the routing lines and through-stack contacts of FIG. 4, in accordance with embodiments of the disclosure.

With reference to FIG. 5, illustrated is the microelectronic device structure 100 of FIG. 1 and FIG. 4, including a schematic illustration of the routing lines 402 and the through-stack contacts 404 of FIG. 4 to more clearly illustrate the one-to-one shared electrical communication between the through-stack contacts 404 and the step contacts 116 (and therefore the steps 114 and conductive structures 106) of the single-step-per-tier stadium 144 and the one-to-multiple shared electrical communication between the through-stack contacts 404 and the step contacts 116 (and therefore the steps 114 and conductive structures 106) of the multi-step-per-tier stadiums 136. The through-stack contact 404 are schematically represented by squares above the crests 132, though the physical through-stack contact 404 structures may be formed and disposed within the horizontal area of the crests 132, extending through the height of the stack 102 to and/or into a source/drain region in the base structure 110 (e.g., as illustrated in FIG. 4).

In some embodiments, the multiple steps 114 provided by a respective stepped tier 138—at a respective tier 108 elevation of the stack 102—are each associated with one of multiple step contacts 116 that are in electrical communication with a single through-stack contact 404.

Still referring to FIG. 5, one or more dielectric material(s) 502 may substantially fill openings (e.g., trenches), referred to herein as "stadium openings" (e.g., "stadium trenches") vertically overlying and partially defined by the stadiums 122 (e.g., the single-step-per-tier stadiums 144, if any, and the multi-step-per-tier stadiums 136) and electrically insulating the step contacts 116 from one another. The step contacts 116 vertically extend through the dielectric material(s) 502 of the filled stadium openings to the steps 114 of the stadiums 122. For ease of illustration, FIG. 1 through FIG.

4 did not illustrate the dielectric material(s) 502. The dielectric material(s) 502 may be formed of and include any one or more insulative materials described above.

Figure 6:
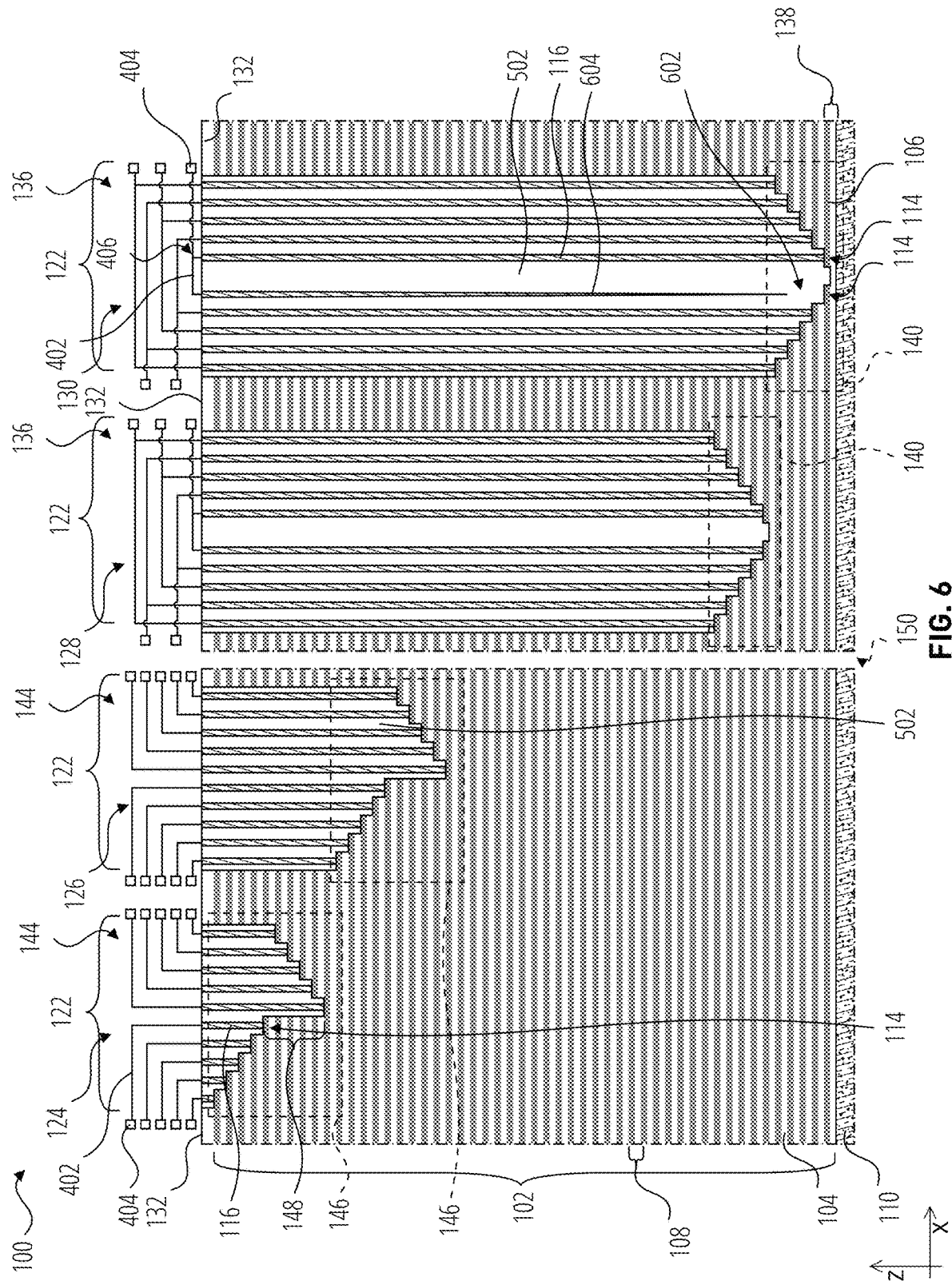
FIG. 6 is a schematic, cross-sectional, elevational view of the microelectronic device structure of FIG. 1, FIG. 4, and FIG. 5, but wherein a step contact has been errantly fabricated and does not physically contact or electrically connect to a step of a respective conductive structure.

With reference to FIG. 6, illustrated is the structure of FIG. 5, but wherein one of the step contacts 116—a so-called "under-formed step contact" 604—has been errantly fabricated (e.g., due to a fabrication error such as incomplete formation of a contact opening in which the step contact 116 was formed, as further discussed below), leaving a gap 602 between the base of the under-formed step contact 604 and the step 114 to which it was intended to extend, if fabricated correctly.

Had the under-formed step contact 604 been formed for one of the single-step-per-tier stadiums 144 (or otherwise been directed to a step 114 of a single-step stepped tier 138), the under-formed step contact's 604 failure to physically contact its associated step 114 would inhibit electrical communication between the conductive structure 106 providing that step 114 and its associated through-stack contact 404. However, for the multi-step-per-tier stadium 136, the inclusion of multiple step contacts 116 per stepped tier 138 facilitates the electrical communication to the conductive structure 106 despite the under-formed step contact 604. That is, if one of multiple step contacts 116 associated with a particular stepped tier 138 (e.g., the lowest stepped tier 138 of the multi-step-per-tier stadium 136) happens to be formed as the under-formed step contact 604, failing to physically contact the conductive structure 106 of the stepped tier 138, one or more others of the multiple step contacts 116, accurately fabricated and associated with that particular stepped tier 138 (e.g., the lowest stepped tier 138), nonetheless provides the electrical communication to the conductive structure 106.

The inclusion of multiple step contacts 116 (e.g., and, in some embodiments, multiple steps 114) per stepped tier 138 for the multi-step-per-tier stadium 136 may significantly lessen the likelihood of failure of an electrical communication to particular conductive structures 106 in the multi-step-per-tier stadium 136. That is, with multiple step contacts 116 per stepped tier 138 (per conductive structure 106), the so-called "failure rate" of the stepped tier 138 (herein the "TFR")—meaning the likelihood of being unable to electrically communicate with a particular stepped tier 138 (conductive structure 106)—is statistically equivalent to the individual step contact's 116 likelihood of failing (herein the "IRF") taken to the power of the quantity (herein "n") of the multiple step contacts 116 per stepped tier 138. That is, TFR=(IRF)^n.

For example, in embodiments such as that of FIG. 6, in which two step contacts 116 (i.e., n=2) are associated with a particular stepped tier 138 (and therefore a particular conductive structure 106), if the likelihood of one step contact 116 experiencing a fabrication failure is, e.g., 10% (i.e., IRF=0.10), then the tier failure rate (TFR) (e.g., likelihood of both stepped step contacts 116 experiencing failure, as would be necessary to inhibit electrical communication to the particular stepped tier 138 (conductive structure 106))—becomes 1% (i.e., TFR=(0.10)^2=0.01=1%). In another embodiment including three steps 114 per stepped tier 138 (and conductive structure 106) (i.e., n=3), a 10% individual fail rate (i.e., IFR=0.10) equates to a tier (conductive structure 106) failure rate (TFR) of 0.1% (i.e., TFR=(0.10)^3=0.001=0.1%).

When considered with respect to the likelihood of any one stepped tier 138 of a multi-step-per-tier stadium 136 failing, this "stadium failure rate" (herein "SFR") may be further significantly improved due to the inclusion of multiple step contacts 116 (and, in some embodiments, multiple steps 114) per stepped tier 138 of the multi-step-per-tier stadium 136. Statistically, the SFR equates to the TFR multiplied by the quantity (herein "m") of the stepped tiers 138 in the multi-step-per-tier stadium 136, i.e., SFR=TFR×m=((IFR)^n)×m.

For example, in embodiments such as that of FIG. 6, in which one multi-step-per-tier stadium 136 includes five stepped tiers 138 (conductive structures 106) (i.e., m=5), each with two steps 114 and associated with two step contacts 116 (i.e., n=2), if the likelihood of one step contact 116 experiencing a fabrication failure is, e.g., 10% (i.e., IFR=0.10), then the stadium failure rate (SFR) becomes 5% (i.e., SFR=((0.1)^2)×5=(0.01)×5=0.05=5%). In contrast, the SFR for single-step-per-tier stadium 144 statistically equates to IFR×m. Therefore, if the single-step-per-tier stadium 144 includes five stepped tiers 138 (conductive structures 106) (i.e., m=5), a 10% individual failure rate (e.g., IFR=0.10), equates to an SFR of 50% (i.e., SFR=0.10×5=0.50=50%), which is a significantly greater stadium failure rate than the 5% SFR of the multi-step-per-tier stadium 136 example.

As illustrated in FIG. 1 and FIG. 4 through FIG. 6, the multiple step contacts 116 associated with a single one of the conductive structures 106 (e.g., providing multiple steps 114) of a single one of the stepped tiers 138 may be step contacts 116 that are within a horizontal area of a common one of the stadiums 122 (e.g., a common multi-step-per tier stadium 136). Each group (e.g., pair) of multiple step contacts 116 may each extend to different steps 114 provided by the same stepped tier 138 or may extend to a same step (e.g., the single lowest step 202 of FIG. 2A, the single highest step 204 of FIG. 2B) provided by the stepped tier 138.

While the microelectronic device structure 100 of FIG. 1 and FIG. 4 through FIG. 6 include stepped tiers 138 that provide multiple steps 114 (and associated with multiple step contacts 116) for at least some stepped tiers 138 of a single stadium 122 (e.g., the multi-step-per-tier stadium 136), in other embodiments, the multiple steps 114 provided by at least one stepped tier 138 may be steps 114 of different stadiums 122. Moreover, the step contacts 116 associated with the one stepped tier 138 may be step contacts 116 within a horizontal area of different ones of the stadiums 122.

Figure 7:
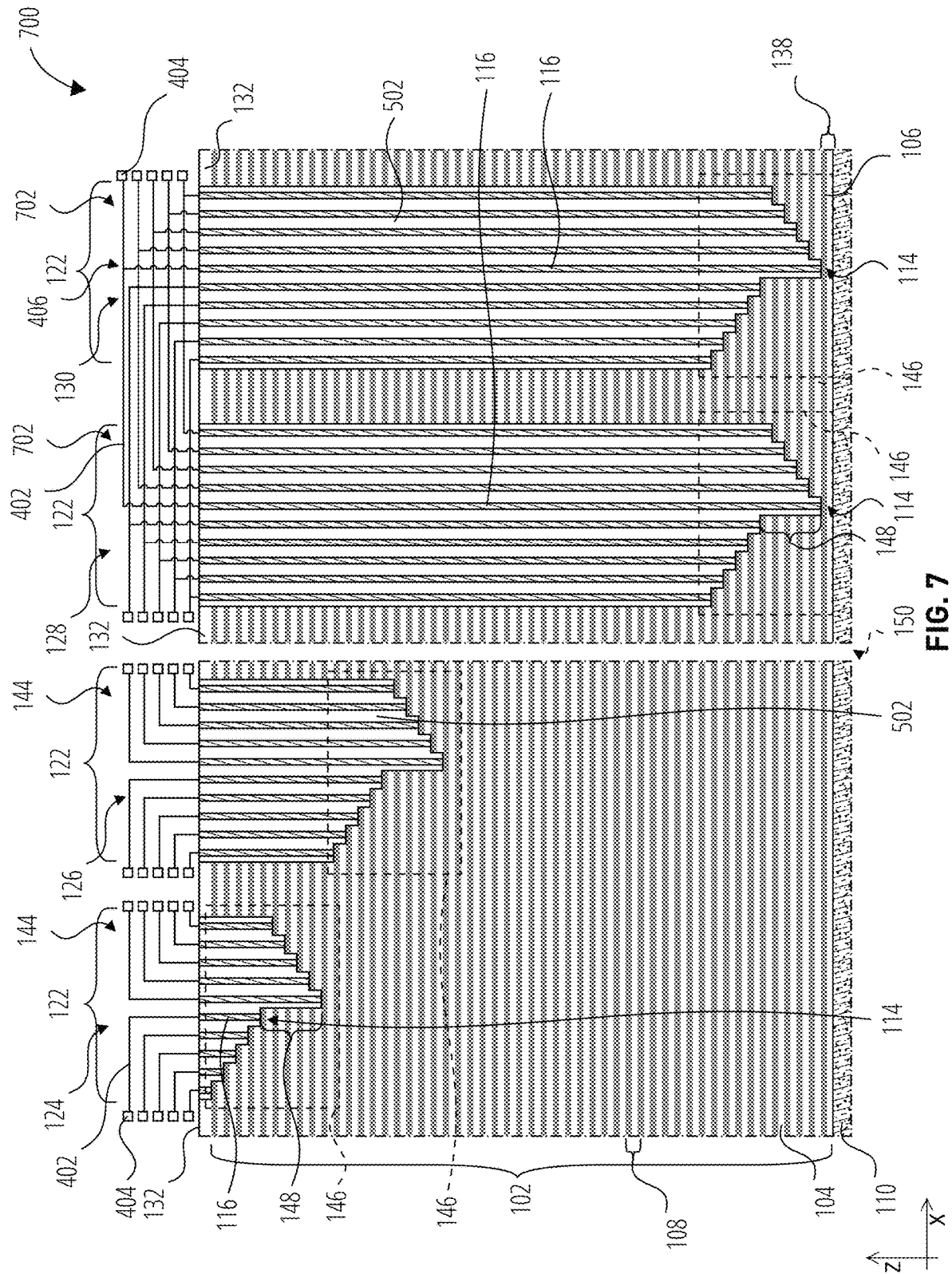
FIG. 7 is a schematic, cross-sectional, elevational view of a microelectronic device structure, according to embodiments of the disclosure, schematically illustrating routing lines and through-stack contacts, wherein the conductive structures each providing multiple steps provide those multiple steps in different stadiums.

For example, and with reference to FIG. 7, a microelectronic device structure 700 includes at least one stepped tier 138 (at least one conductive structure 106) with multiple steps 114 that are each defined in a respective one of a group (e.g., a pair) of duplicate stadiums 702, such as neighboring relatively-deep stadiums 122. Each of the duplicate stadiums 702 of a respective group (e.g., a pair) may have a staircase profile with steps 114 provided through the same tier 108 elevations as each other of the duplicate stadiums 702 of the group so as to provide one step 114 of a respective stepped tier 138 in one of the duplicate stadiums 702 and to provide a multiple step 114 of the respective stepped tier 138 in one other of the duplicate stadiums 702. Therefore, each of the duplicate stadiums 702 of a respective group (e.g., pair) of duplicate stadiums 702 may be at the same (e.g., common) depth(s) in the stack 102 as one another.

Step contacts 116 extend to the steps 114 in a one-to-one association, for example, and routing lines 402 (and, in some embodiments, junctions 406) may electrically connect one step contact 116—extending to one step 114 of a stepped tier 138 of one of the duplicate stadiums 702—to a multiple step contact 116—extending to a multiple step 114 of the stepped tier 138 of a multiple of the duplicate stadiums 702—and to a respective one of the through-stack contacts 404 in a neighboring crest 132.

While FIG. 7 illustrates the microelectronic device structure 700 with a single pair of duplicate stadiums 702 that together provide two steps 114 per stepped tier 138 in the lowest ten tiers 108 of the stack 102, in other embodiments, one or more additional duplicate stadiums 702 may be formed with steps 114 (and staircases) in the same tier 108 elevations, so as to provide more than two duplicate stadiums 702 together providing more than two multiple steps 114 per stepped tier 138. More than two step contacts 116 may therefore extend, to the respective stepped tier 138 (and conductive structure 106), each within the horizontal area of one of the different duplicate stadiums 702 of the group of multiple duplicate stadiums 702.

One or more additional groups (e.g., pairs) of duplicate stadiums 702 with staircase profiles in an additional group of tier 108 elevations may provide an additional group of multiple steps 114 per stepped tier 138, such as in the next ten tier 108 elevations of the stack 102 (e.g., in the intermediate region 150). Additional groups (e.g., pairs) of multiple step contacts 116 may each extend to respective stepped tiers 138 of the additional tier 108 elevations.

The staircase profile of each duplicate stadium 702 may be any one of the staircase profiles described above for the single-step-per-tier stadiums 144, illustrated in box 146 in FIG. 1, FIG. 3A, FIG. 3B, FIG. 3C, FIG. 3D, and FIG. 3E. The staircase profiles of each of an associated group (e.g., pair) of duplicate stadiums 702 may have the same configuration as one another, as illustrated in FIG. 7, or may be differently configured (e.g., mirrored to one another or neither mirrored nor the same) provided the tier 108 elevations of the steps 114 of one of the duplicate stadiums 702 are the same tier 108 elevations of the steps 114 of another of the duplicate stadiums 702.

While FIG. 7 illustrates the duplicate stadiums 702 of a particular group (e.g., pair) as being directly neighboring stadiums 122 (e.g., the third stadium 128 and the fourth stadium 130 of the block 112 (FIG. 1)), in other embodiments, one or more others of the stadiums 122 may be interposed between the duplicate stadiums 702 of the particular group (e.g., pair). Such interposed stadium 122 (or stadiums 122) may be one or more single-step-per-tier stadiums 144, one or more multi-step-per-tier stadiums 136 (FIG. 1), or one or more duplicate stadiums 702 of a different group (e.g., pair) of duplicate stadiums 702.

Accordingly, the microelectronic device structure 700 provides at least some stepped tiers 138 with multiple steps 114—and, therefore, at least some conductive structures 106 associated with multiple step contacts 116—wherein at least one of the multiple steps 114 is within a different stadium 122 than at least one other of the multiple steps 114, and at least one of the multiple step contacts 116 extends to a different stadium 122 than the stadium 122 to which at least one other of the multiple step contacts 116 extends.

Regardless of in which horizontal stadium area, of the multiple duplicate stadiums 702, the individual step contacts 116 of a group (e.g., pair) of multiple step contacts 116 extend, the grouped multiple step contacts 116 may share electrical communication to a common one of the through-stack contacts 404, as schematically illustrated in FIG. 7.

Figure 8:
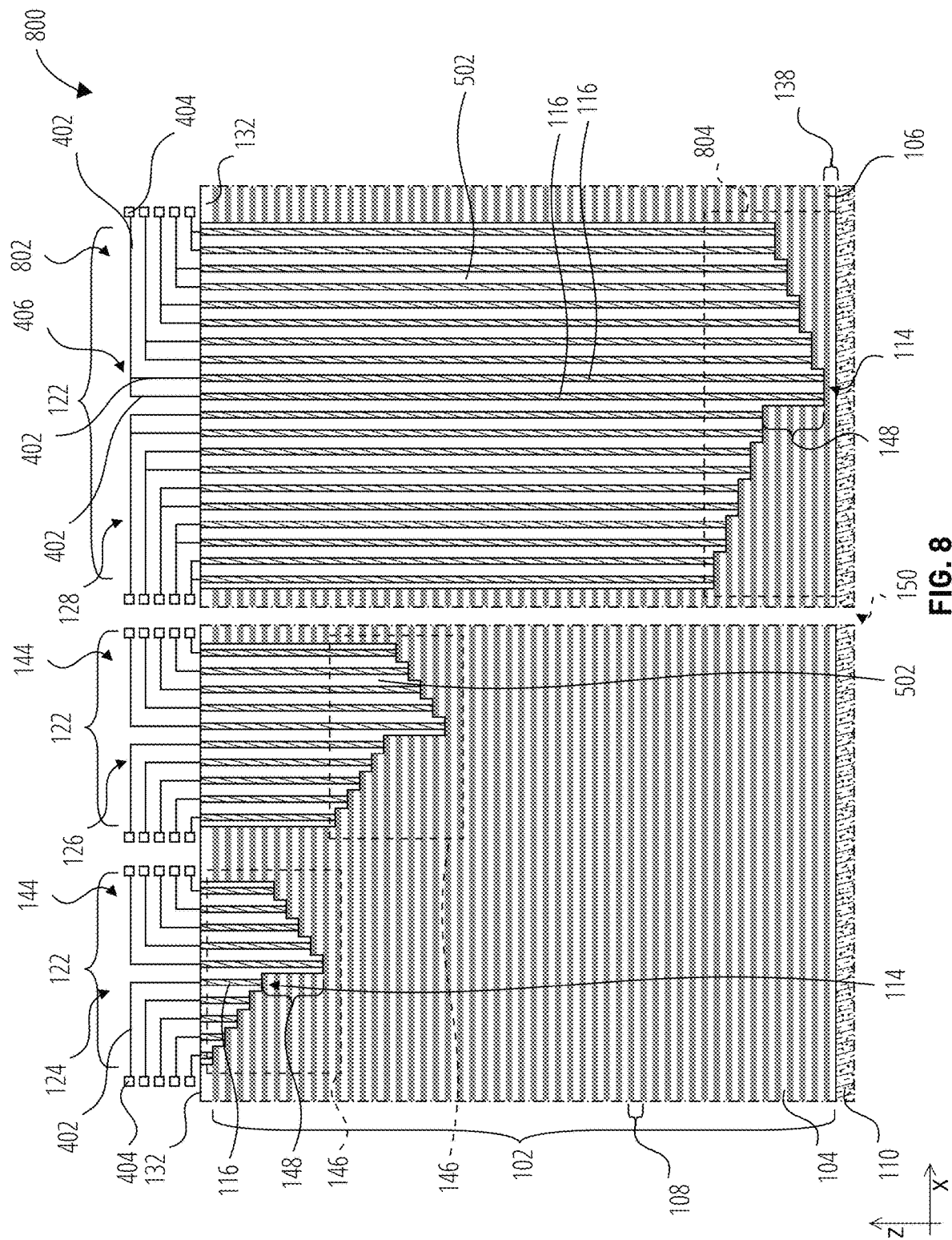
FIG. 8 is a schematic, cross-sectional, elevational view of a microelectronic device structure, according to embodiments of the disclosure, schematically illustrating routing lines and through-stack contacts, wherein at least one stadium defines relatively-wider and/or relatively-longer steps to each of which multiple step contacts extend.

With reference to FIG. 8, in some embodiments, a microelectronic device structure 800 may provide multiple steps 114 and multiple step contacts 116 per at least one stepped tier 138 (at least one conductive structure 106) by providing relatively-wider and/or relatively-longer steps 114 of the respective conductive structure 106 of the stepped tier 138. For example, at least one stepped tier 138 may include a relatively-wider and/or relatively-longer step 114 compared to the steps 114 in stadiums 122 not providing multiple steps 114 per stepped tier 138, such as compared to the single-step-per-tier stadiums 144. The relatively-wider and/or relatively-longer steps 114 may provide, effectively, the surface area of multiple steps 114 of the single-step-per-tier stadiums 144. These relatively-wider and/or relatively-longer steps 114 may each be at a different one of the tier 108 elevations of the stepped tiers 138 of the stadium 122, which stadium 122 may be referred to herein as a "multi-step-contacts-per-tier stadium" 802.

The staircase profile of the multi-step-contacts-per-tier stadium 802 may be any one of the staircase profiles described above for the single-step-per-tier stadiums 144 with respect to box 146 of FIG. 1, FIG. 3A, FIG. 3B, FIG. 3C, FIG. 3D, and FIG. 3E but with relatively-wider and/or relatively-longer steps 114. Accordingly, for example, the staircase profile of box 804 of FIG. 8 is substantially equivalent to the staircase profile of the single-step-per-tier stadiums 144 illustrated in box 146 of FIG. 1 (and in FIG. 8), but with relatively double-width steps 114. Thus, in any of the above-described multi-step-per-tier stadiums 136, the staircase profile illustrated in box 804 of FIG. 8 may alternatively replace the staircase profile of any above-described box 140.

Multiple step contacts 116 extend to at least some (e.g., each) respective multiple-sized step 114 of the multi-step-contacts-per-tier stadium 802. The multiple step contacts 116 for a respective stepped tier 138 may be electrically connected to a same (e.g., a common) one of the through-stack contacts 404 via routing lines 402 (and, in some embodiments, the junction 406).

While the microelectronic device structure 800 of FIG. 8 illustrates only a single multi-step-contacts-per-tier stadium 802, providing relatively-larger steps 114 and multiple step contacts 116 for each of the stepped tiers 138 in the deepest ten tier 108 elevations of the stack 102, in other embodiments, more than one of the stadiums 122 in a given block 112 (FIG. 1) may be configured as the multi-step-contacts-per-tier stadium 802, and these other multi-step-contacts-per-tier stadiums 802 may be formed in other groups of tier 108 elevations in the stack 102 (e.g., in the intermediate region 150).

In some embodiments, all tiers 108 and/or all stadiums 122 of a given block 112 (FIG. 1) may be associated with multiple step contacts 116 (and, in some embodiments, multiple steps 114). For example, with reference to FIG. 9, each stadium 122 of the block 112 (FIG. 1) may be configured as any of the multi-step-per-tier stadiums 136 with any of the staircase profiles of box 140 of FIG. 1, FIG. 3A, FIG. 3B, FIG. 3C, FIG. 3D, and FIG. 3E or as the multi-step-contacts-per-tier stadium 802 (FIG. 8) with the staircase profile of box 804 of FIG. 8.

Accordingly, disclosed are a microelectronic device. The microelectronic device comprises a stack structure comprising insulative structures vertically interleaved with conductive structures and arranged in tiers. A series of stadiums is in the stack structure. At least one of the stadiums has steps at least partially defined by the conductive structures of a first group of the tiers. At least one other of the stadiums has additional steps at least partially defined by the conductive structures of a second group of the tiers. The first group of the tiers is at elevations lower than elevations of the second group of the tiers. Conductive contacts are within horizontal areas of stadiums of the series of stadiums. The conductive contacts comprise pairs of the conductive contacts and ones of the conductive contacts. Each of the pairs of the conductive contacts extend to a different one of the conductive structures of the first group of the tiers than each other of the pairs of the conductive contacts. The ones of the conductive contacts each extend to a different one of the conductive structures of the second group of the tiers than each other of the ones of the conductive contacts.

Figure 9:
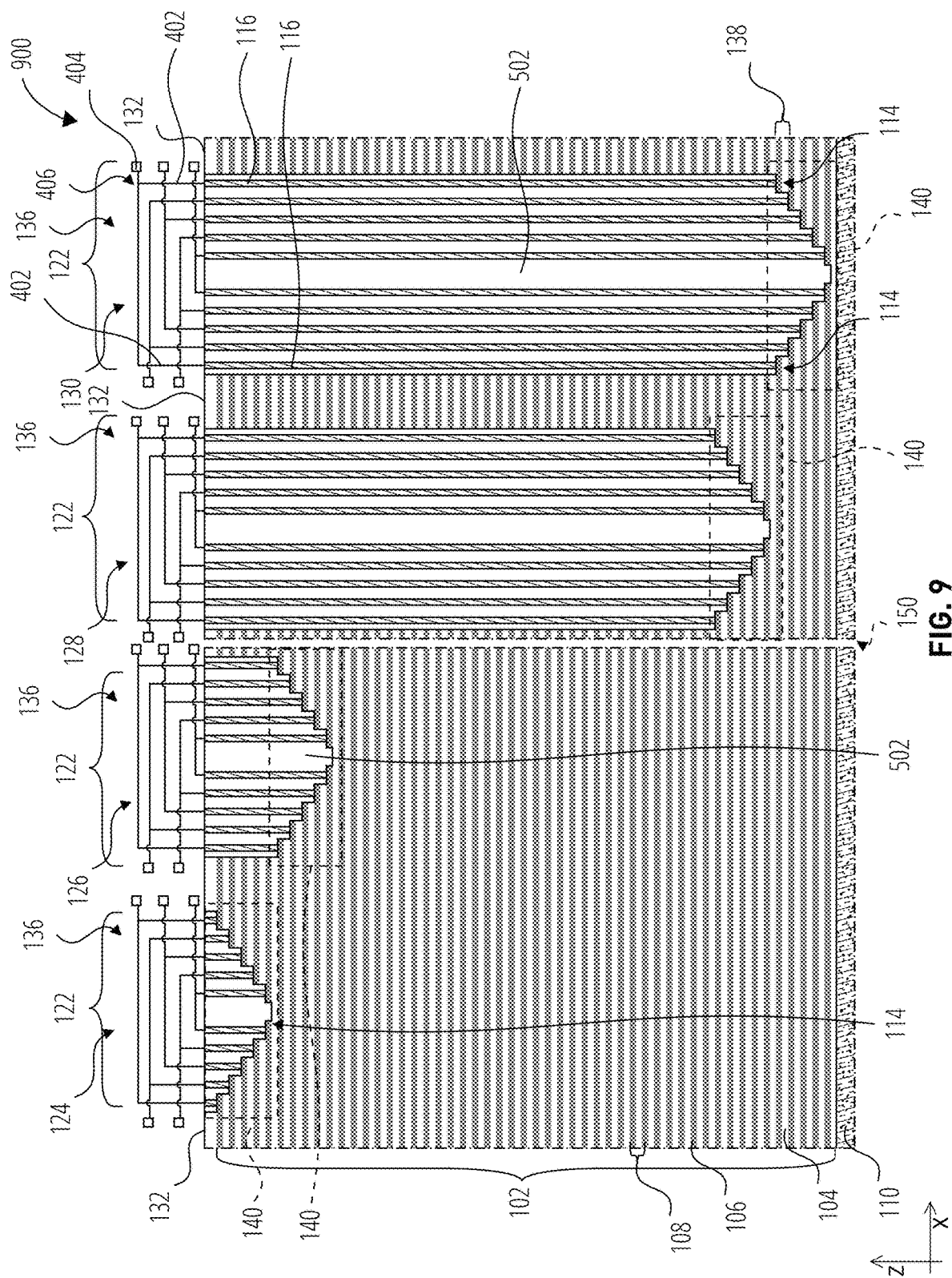
FIG. 9 is a schematic, cross-sectional, elevational view of a microelectronic device structure, according to embodiments of the disclosure, schematically illustrating routing lines and through-stack contacts, wherein each of the stadiums of a series of stadiums defines multiple steps per stepped tier.
Figure 10:
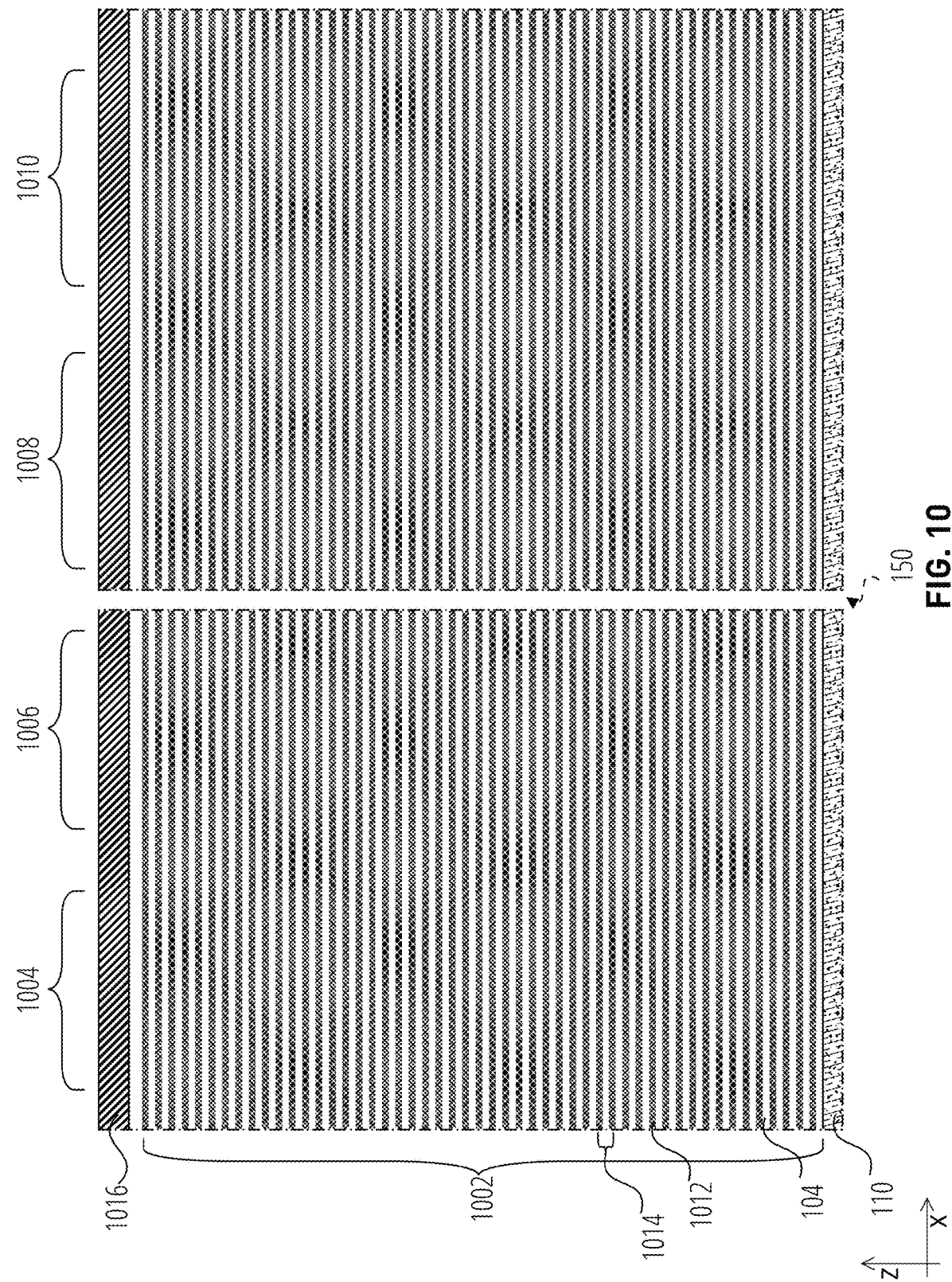
FIG. 10 through FIG. 25 are schematic, cross-sectional, elevational views of various stages of processing to fabricate a microelectronic device structure in accordance with embodiments of the disclosure, such any of the aforementioned microelectronic device structures.

With reference to FIG. 10 to FIG. 25, illustrated are various stages of forming a microelectronic device, such as one including the microelectronic device structure 100 of any of FIG. 1 and FIG. 4 to FIG. 6, the microelectronic device structure 700 of FIG. 7, the microelectronic device structure 800 of FIG. 8, and the microelectronic device structure 900 of FIG. 9, wherein any staircase profile illustrated in a box 140 in any of the drawings may be substituted for any other staircase profile illustrated in a box 140 or a box 804 of FIG. 10 to FIG. 25, and wherein any staircase profile illustrated in a box 146 in any of the drawings may be substituted for any other staircase profile illustrated in a box 146 of FIG. 10 to FIG. 25.

A stack 1002 (otherwise referred to herein as a "stack structure" or "tiered stack") is formed on the base structure 110, including in areas (e.g., a first stadium area 1004, a second stadium area 1006, a third stadium area 1008, a fourth stadium area 1010) in which the series of stadiums 122 (FIG. 1) will be formed. In some embodiments, the stack 1002 is formed to include a vertically alternating sequence of the insulative structures 104 and sacrificial structures 1012 arranged in tiers 1014. The sacrificial structures 1012 may be formed at elevations of the stack 1002 that will eventually be replaced with, or otherwise converted into, the conductive structures 106 (e.g., FIG. 1). In other embodiments, the stack 1002 may be formed to include the conductive structures 106 instead of the sacrificial structures 1012, even without replacement or conversion, such that the stack 1002 may have substantially the materials of the stack 102 of FIG. 1. Accordingly, the stack 1002 is formed to include the insulative structures 104 and "other structures," which other structures may be either the sacrificial structures 1012 or the conductive structures 106.

To form the stack 1002, formation (e.g., deposition) of the insulative structures 104 may be alternated with formation (e.g., deposition) of the other structures (e.g., the sacrificial structures 1012). In some embodiments, the stack 1002 is formed, at this stage, to include as many tiers 1014 with the sacrificial structures 1012 as there will be tiers 108 (FIG. 1) with conductive structures 106 (FIG. 1) in the final structure (e.g., the microelectronic device structure 100 of any of FIG. 1 and FIG. 4 through FIG. 6, the microelectronic device structure 700 of FIG. 7, the microelectronic device structure 800 of FIG. 8, the microelectronic device structure 900 of FIG. 9).

One or more hardmasks 1016 may also be included on (e.g., above) the stack 1002 and utilized in subsequent material-removal (e.g., etching, patterning) processes.

Figure 11:
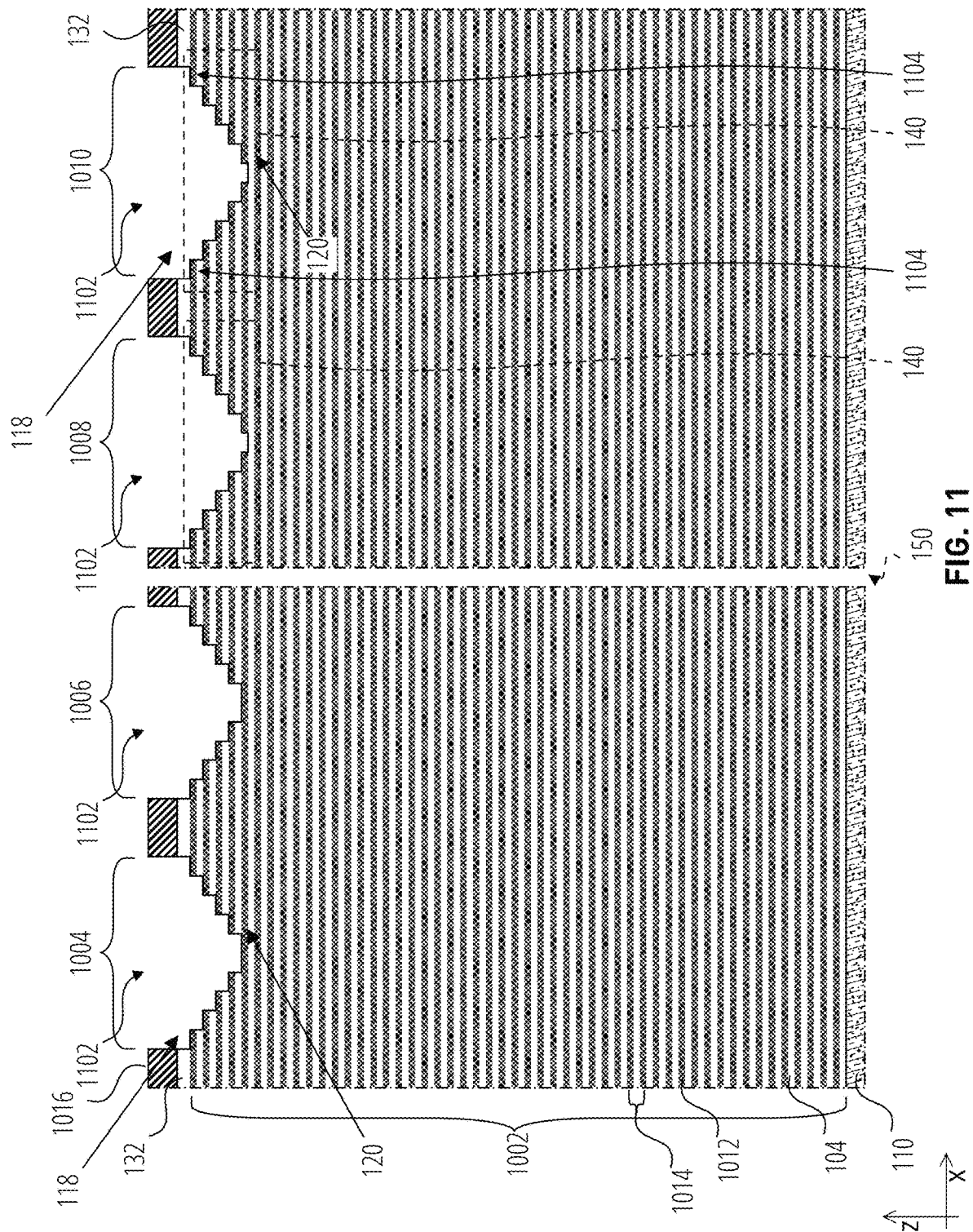
Figure 12:
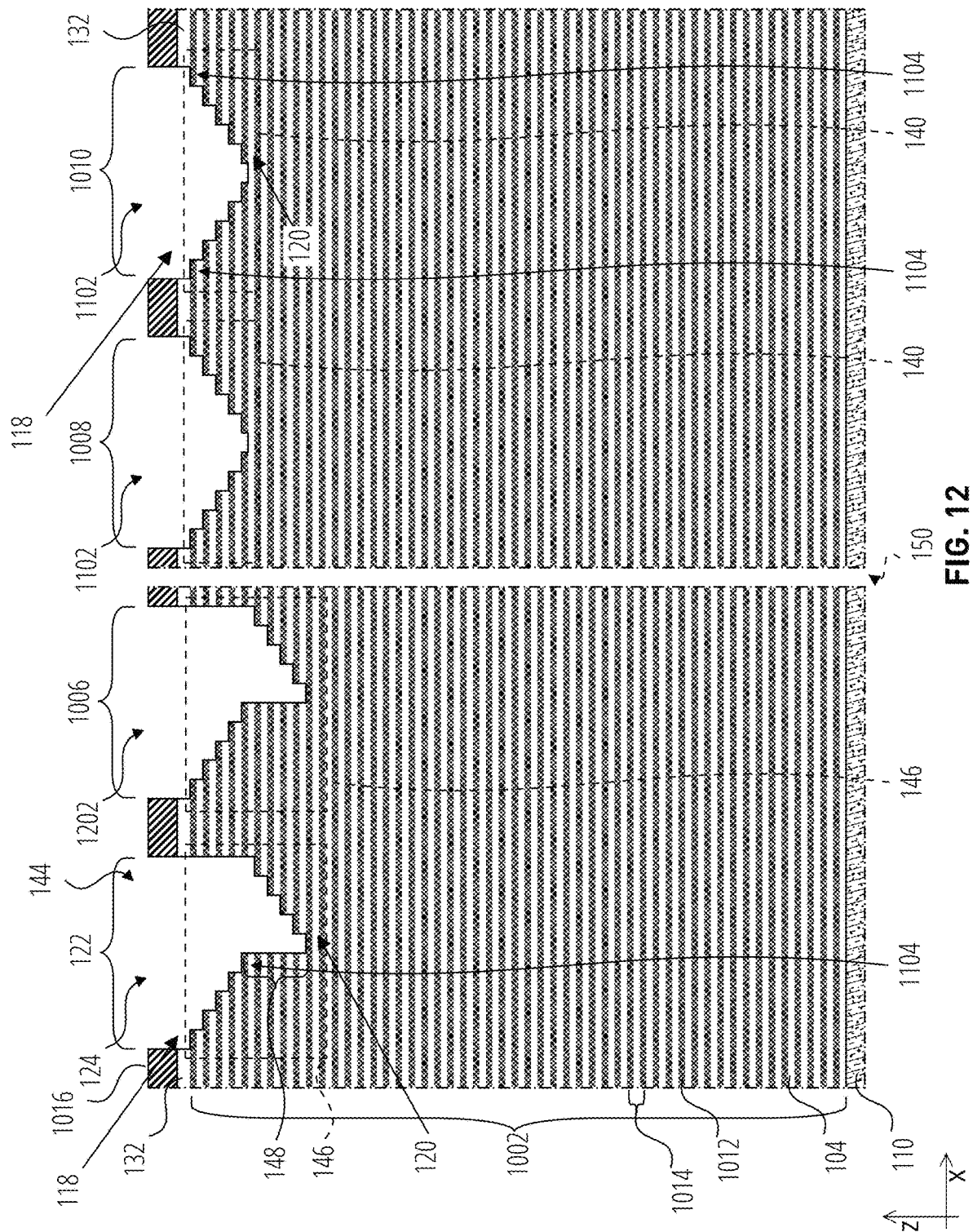

With reference to FIG. 11, the stack 1002 (and the hardmask 1016) is patterned to define initial stadium openings 1102 in the footprint (e.g., horizontal) area (e.g., the first stadium area 1004, the second stadium area 1006, the third stadium area 1008, the fourth stadium area 1010) for the stadiums 122 (FIG. 1) to be formed. Areas of the stack 1002 for the crests 132 (FIG. 1) and the bridges 134 (FIG. 1) may not be etched so that they retain the full height of the stack 1002.

As used herein, the term "stadium opening" (e.g., as in the initial stadium opening 1102) means and includes an opening that includes, along the width of its base, the at least one staircase profile, such that the base of the stadium opening defines exposed surfaces 1104 of the sacrificial structures 1012 at different tier 1014 elevations.

Forming the initial stadium openings 1102 defines a staircase profile with one or more staircases (e.g., the ascending staircase 120, the descending staircase 118). The particular staircase profile formed in each initial stadium opening 1102 may be tailored according to the staircase profile of the final stadium 122 (FIG. 1, FIG. 7, FIG. 8, FIG. 9) to be formed. In the stadium areas where the final stadiums 122 do not include a vertical offset—such as with the staircase profiles of box 140 of FIG. 1, FIG. 2A, FIG. 2B, FIG. 2C, FIG. 2D, and FIG. 9 and with the staircase profiles of box 146 of FIG. 3D and FIG. 3E—the staircase profile of the initial stadium openings 1102 may be substantially the staircase profile of the final stadium 122 (FIG. 1, FIG. 7, FIG. 8, FIG. 9) to be formed. In the stadium areas where the final stadiums 122 are to include the vertical offset 148 (FIG. 1)—such as the staircase profiles of box 146 of FIG. 1, FIG. 3A, FIG. 3B, FIG. 3C, FIG. 7, and FIG. 8 and of box 804 of FIG. 8—the staircase profile partially defined by the initial stadium opening 1102 may correspond to a staircase profile of the final stadium 122 but without the offset 148 at this stage.

Each of the initial stadium openings 1102 may be formed, in each stadium area (e.g., the first stadium area 1004, the second stadium area 1006, the third stadium area 1008, the fourth stadium area 1010) in substantially the same uppermost tier 1014 elevations of the stack 1002.

Forming each of the initial stadium openings 1102 may include a sequence of material-removal (e.g., etching) acts by which the hardmask 1016 is patterned to define an opening of a first width, which first-width opening is then etched to a first depth, such as a depth of the quantity ("q") (e.g., five) of the tiers 1014 that are to be included in the staircase profile. Then, the hardmask 1016 may be trimmed to expand the opening to a second width, which second-width opening is then patterned a depth of q−1 (e.g., four) of the tiers 1014. Then, the hardmask 1016 may be trimmed to expand the opening to a third width, which third-width opening is then patterned a depth of q−2 (e.g., three) of the tiers 1014. This may be repeated until completing the profile of the ascending staircase 120 and the descending staircase 118 that are opposing and mirrored.

In embodiments in which the initial stadium opening 1102 is formed to define the staircase profile of box 140 of FIG. 1, an initial hardmask 1016 patterning and etching act may be at a width substantially equal to that of the staircase landing 142 (FIG. 1), and this width may be etched to a depth extending through the sacrificial structure 1012 that initially defines the lowest exposed surface 1104 (for steps 114 (FIG. 1)) of the staircases (e.g., the ascending staircase 120 and the descending staircase 118). For example, the initial width may be etched to a depth of q+½ of the tiers 1014 that are to be included in the staircase profile.

The initial stadium openings 1102 may be formed substantially simultaneously for each of the stadium areas (e.g., the first stadium area 1004, the second stadium area 1006, the third stadium area 1008, the fourth stadium area 1010). In other embodiments, any of the initial stadium openings 1102 may be formed sequentially in whole or in part.

In the stadium areas (e.g., first stadium area 1004, second stadium area 1006) that are to include vertical offsets 148 (FIG. 1) (e.g., such as for the single-step-per-tier stadiums 144 with the staircase profiles of box 146 according to any of FIG. 1, FIG. 3A, FIG. 3B, FIG. 3C, FIG. 7, and FIG. 8;

the duplicate stadiums 702 with the staircase profiles of box 146 of FIG. 7; and the multi-step-contacts-per-tier stadium 802 with the staircase profile of box 804 of FIG. 8), half of each stadium width may be etched to lower the staircase profile the offset 148 distance for that half of the stadium. For example, with regard to FIG. 12, the right-half of the first stadium area 1004 (FIG. 11) and the second stadium area 1006 is etched to lower the ascending staircases 120 the vertical offset 148 distance into the stack 1002. This half-stadium vertical offset defines offset stadium openings 1202 in the first stadium area 1004 (FIG. 11) and the second stadium area 1006.

In embodiments in which others of the stadiums 122 to be formed have staircase profiles that do not include the vertical offset 148, the staircase profiles formed in the corresponding stadium areas (e.g., the third stadium area 1008, the fourth stadium area 1010) may not be altered during the offsetting (e.g., in the first stadium area 1004 (FIG. 11) and the second stadium area 1006).

In embodiments in which the staircase profile of the shallowest stadium 122 of the block 112 (FIG. 1) includes the offset 148, forming the offset stadium openings 1202 completes the formation of the first stadium 124 as the single-step-per-tier stadium 144.

For the stadium areas where the initial stadium openings 1102 and the offset stadium openings 1202 do not yet extend to their final tier 1014 elevations (e.g., depths) in the stack 1002, these openings may be extended in a series of material-removal (e.g., etching) acts.

Figure 13:
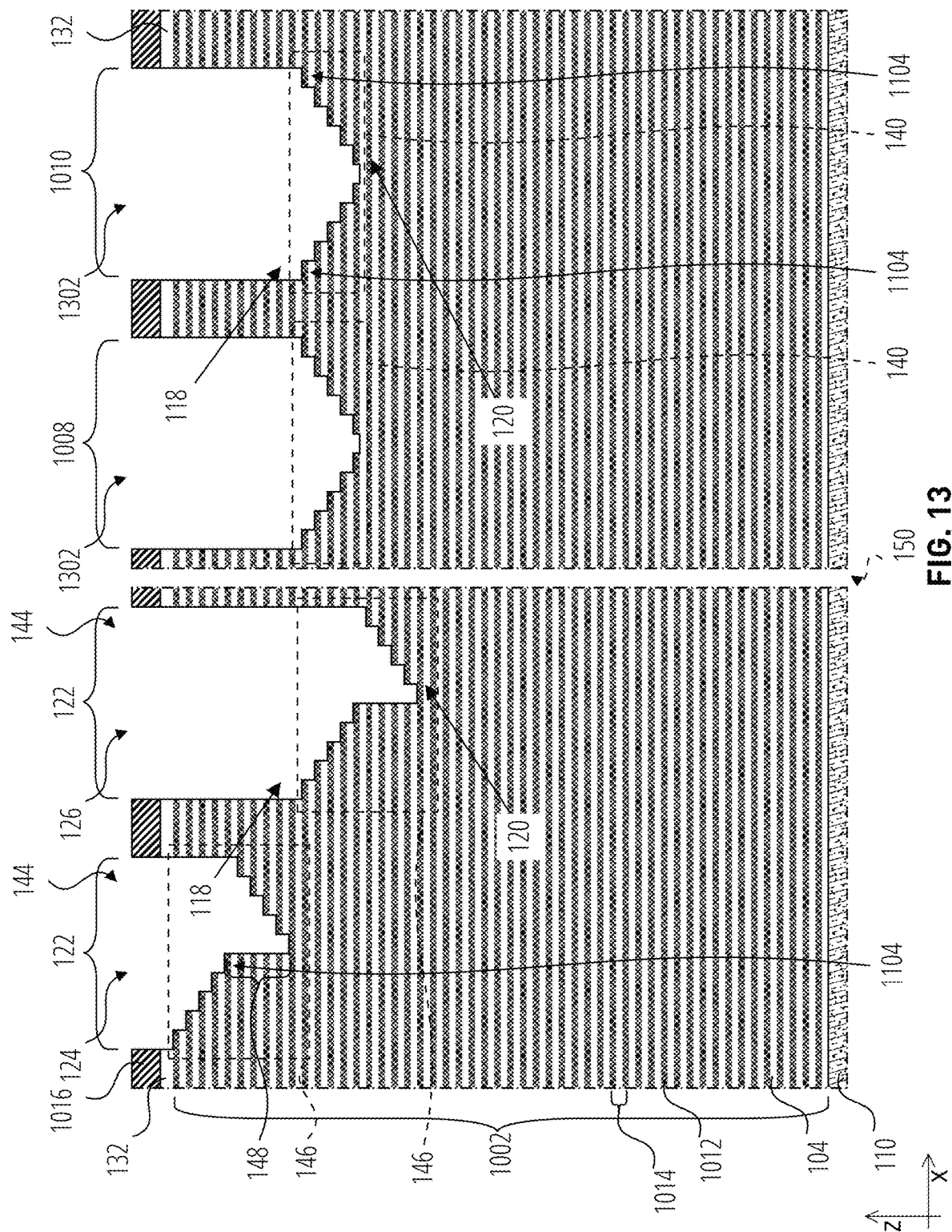
Figure 14:
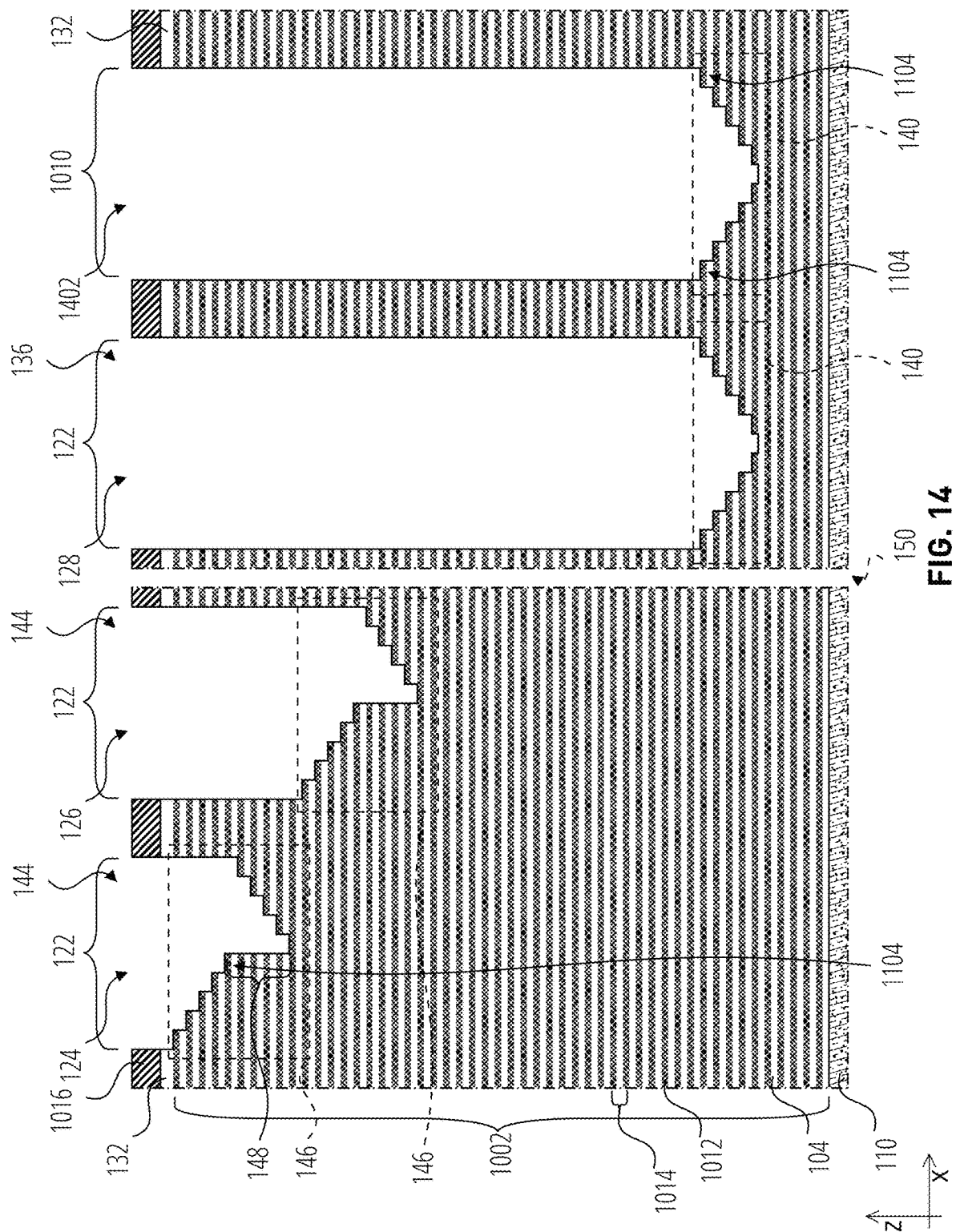

For example, the offset stadium opening 1202 in the second stadium area 1006 may be extended deeper into the stack 1002 while the initial stadium openings 1102 in the third stadium area 1008 and in the fourth stadium area 1010 are extended also deeper into the stack 1002. As illustrated in FIG. 13, this extension may complete the fabrication of the stadium 122 in the second stadium area 1006 (FIG. 12) (e.g., forming the second stadium 126) and form extended partial stadium openings 1302 in each of the third stadium area 1008 and the fourth stadium area 1010. The extension may substantially maintain the staircase profile(s) already defined in earlier stages, though the staircase profile(s) are extended to lower elevations.

While extending at least some of the stadium openings (e.g., to form the second stadium 126 and the extended partial stadium openings 1302 of the third stadium area 1008 and the fourth stadium area 1010), the already-completed stadium 122 of the first stadium 124 may not be altered.

Figure 15:
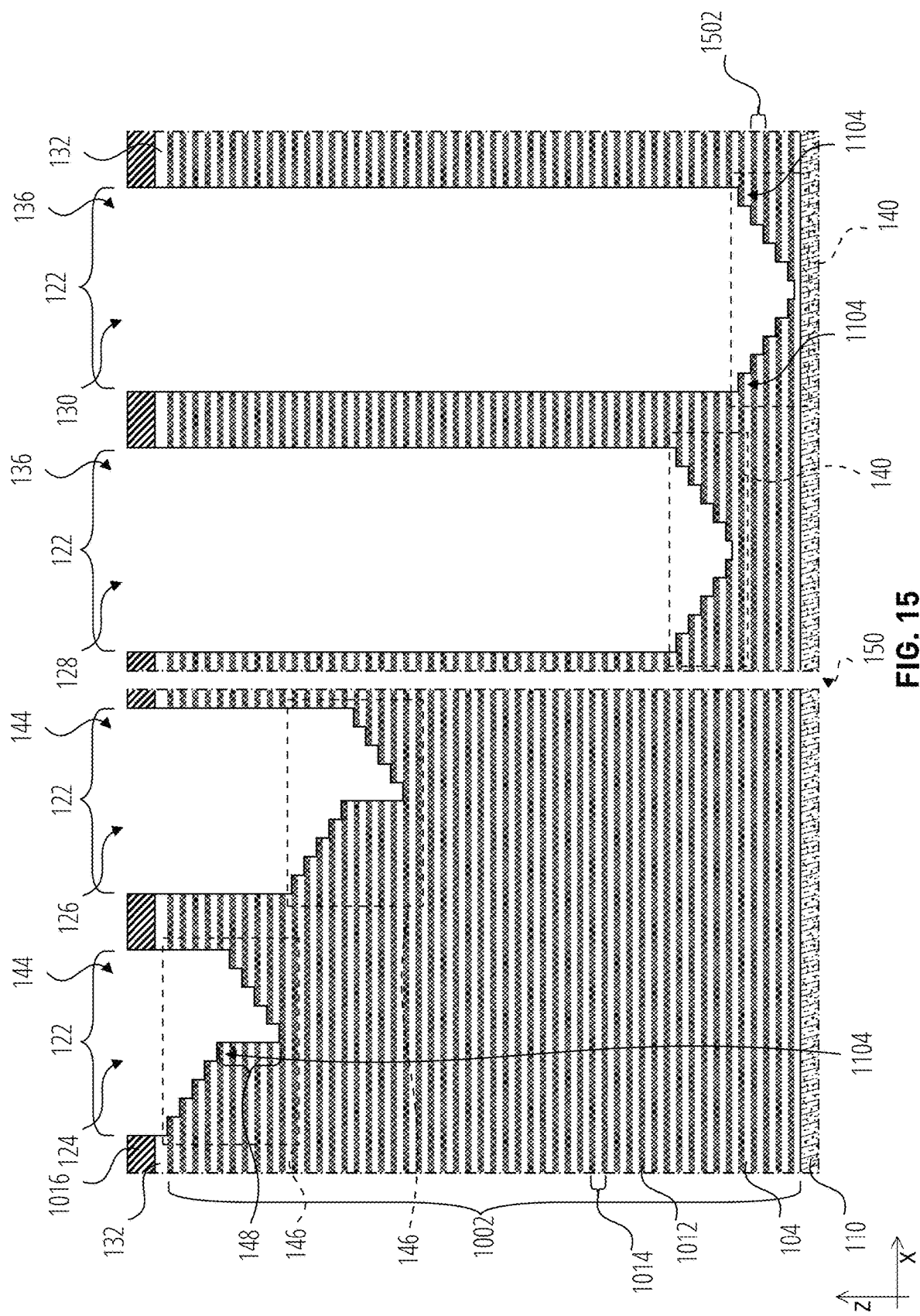

The stadium opening extensions are continued deeper and deeper into the stack 1002 for each of the stadium areas where the staircase profiles are not yet at their final tier 1014 elevations (e.g., depths) in the stack 1002. Therefore, with reference to FIG. 14, the extensions may continue until the third stadium 128 is at its final depth, at which stage the fourth stadium area 1010 includes a further extended partial stadium opening 1402. Then, the further extended partial stadium opening 1402 in the fourth stadium area 1010 is extended to complete the fourth stadium 130, as illustrated in FIG. 15.

After the extensions, the stadiums 122 define substantially their final staircase profiles with stepped tiers 1502 having exposed surfaces 1104 of the sacrificial structures 1012 where the stadiums 122 will eventually have steps 114 (FIG. 1) defined, in part, by the conductive structures 106 (FIG. 1) of the tiers 108 (FIG. 1).

Figure 16:
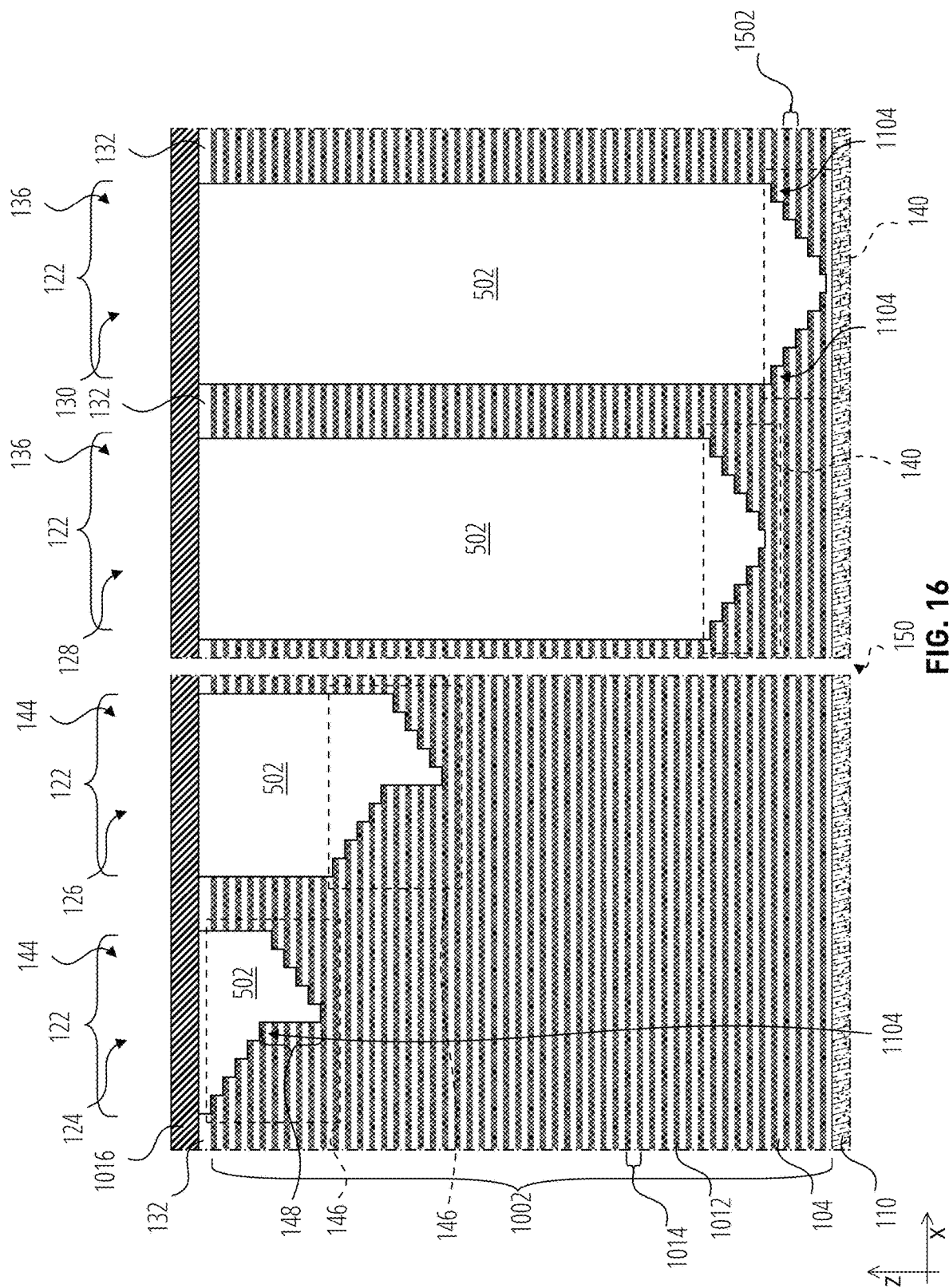

With reference to FIG. 16, the dielectric material(s) 502 is(are) formed (e.g., deposited) to substantially fill each stadium opening (e.g., stadium trench) above the completed stadiums 122. The hardmask 1016 may be re-formed above the stack 1002 and the dielectric material(s) 502.

Figure 17:
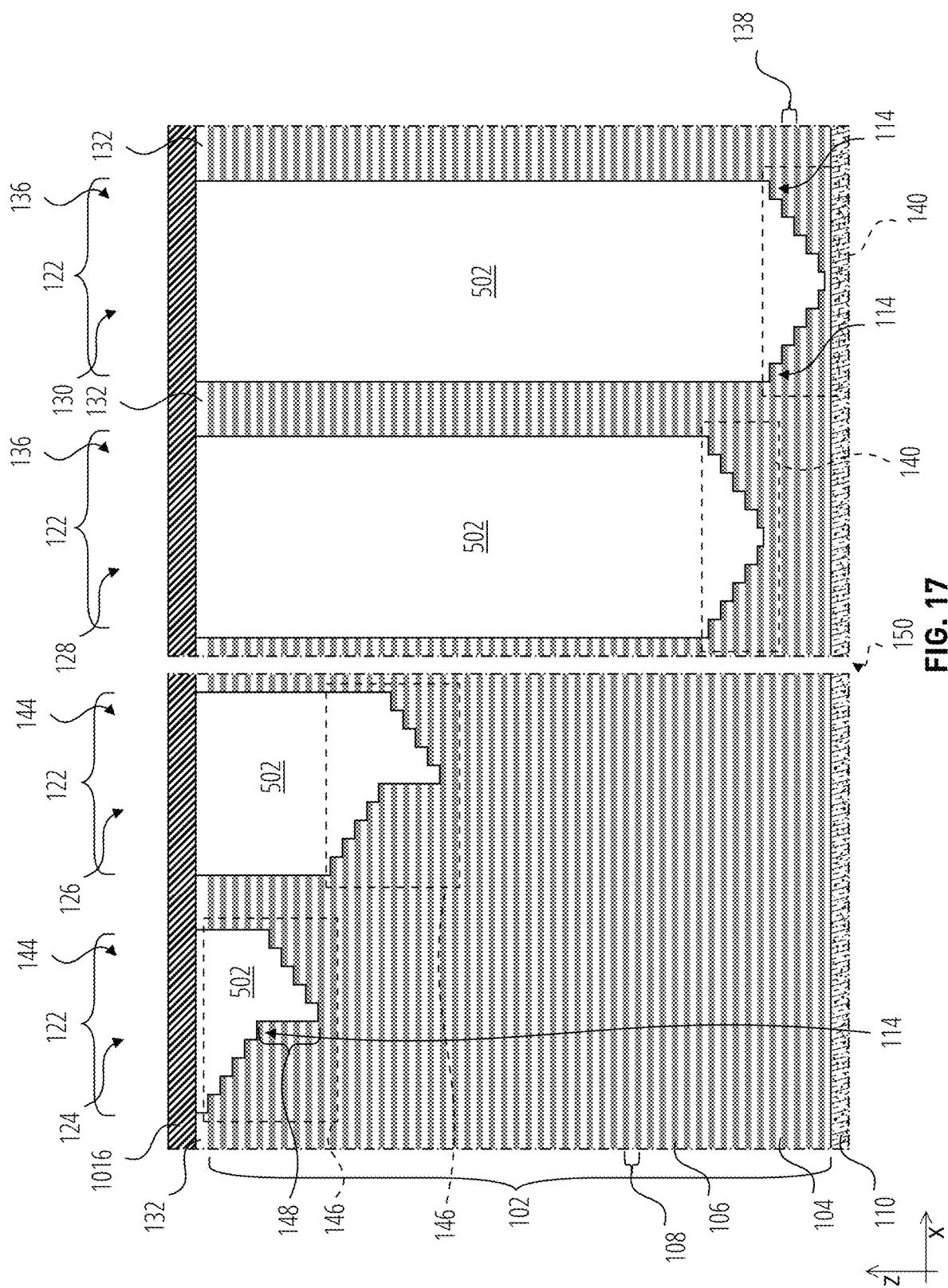

In embodiments in which the stack 1002 was formed to include sacrificial structures 1012 (rather than the conductive structures 106), the sacrificial structures 1012 may be substantially removed (e.g., exhumed) and replaced with the conductive material(s) of the conductive structures 106—or may be otherwise converted to the conductive material(s)—to form, as illustrated in FIG. 17, the stack 102 with the tiers 108 of the conductive structures 106 and the insulative structures 104. By this replacement process, the stadiums 122 then include the steps 114 at the conductive structures 106 of the stepped tiers 138.

Figure 18:
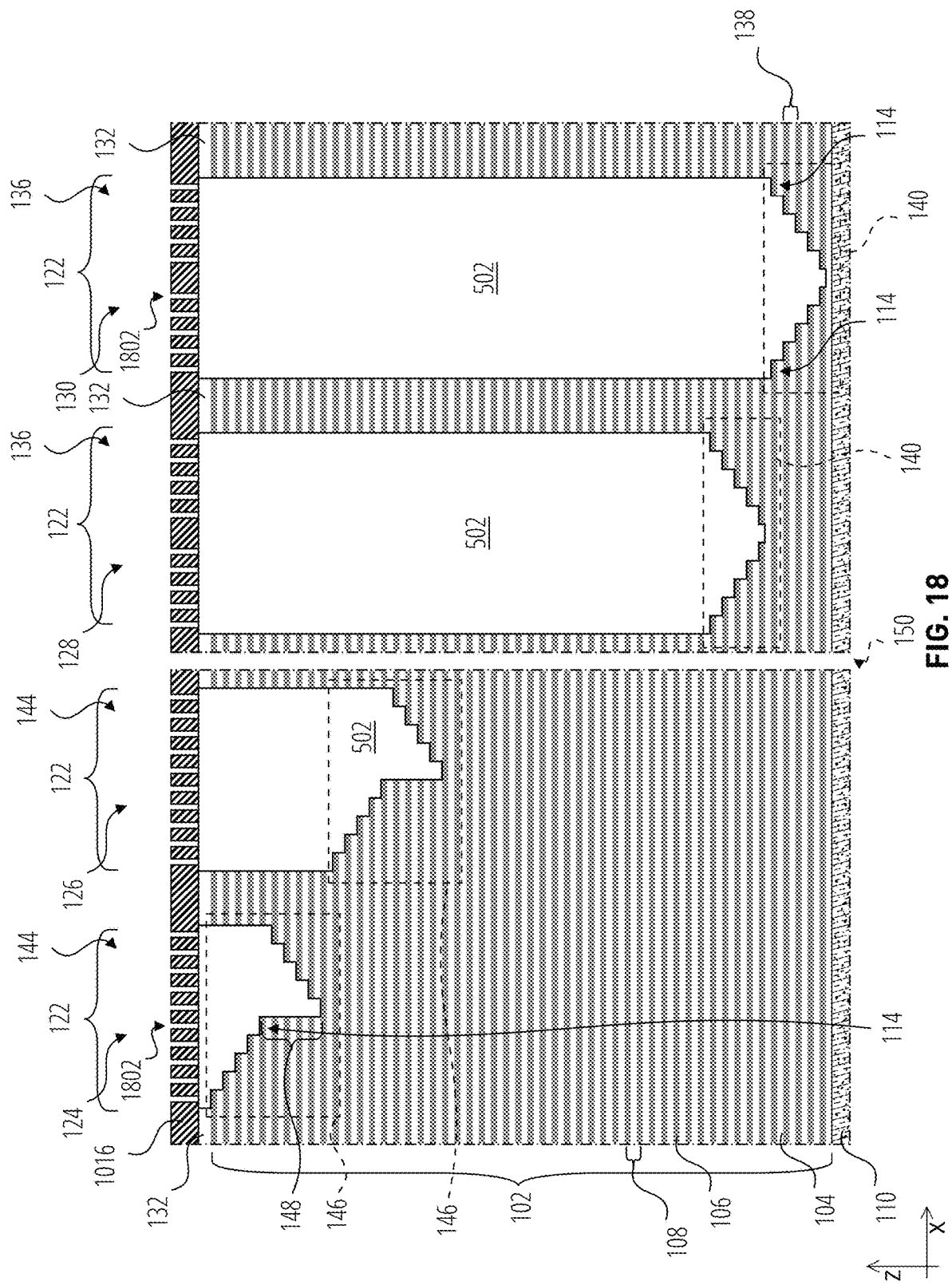

With reference to FIG. 18, the hardmask 1016 is patterned to define openings 1802 in the areas where the step contacts 116 (FIG. 1) are to be formed. In some embodiments, the openings 1802 defined for the step contacts 116 (FIG. 1) to the relatively-deeper stadiums (e.g., the third stadium 128 and the fourth stadium 130) may be formed relatively wider than the openings 1802 defined for the step contacts 116 (FIG. 1) to the relatively-shallower stadiums 122 (e.g., the first stadium 124 and the second stadium 126) so that, once the openings 1802 are extended downward through the dielectric material(s) 502 to their respective steps 114, the bottom dimension of the openings 1802 will be sufficient to fabricate the step contacts 116 in physical contact with their respective steps 114 despite, e.g., tapering through the stack 102.

Figure 19:
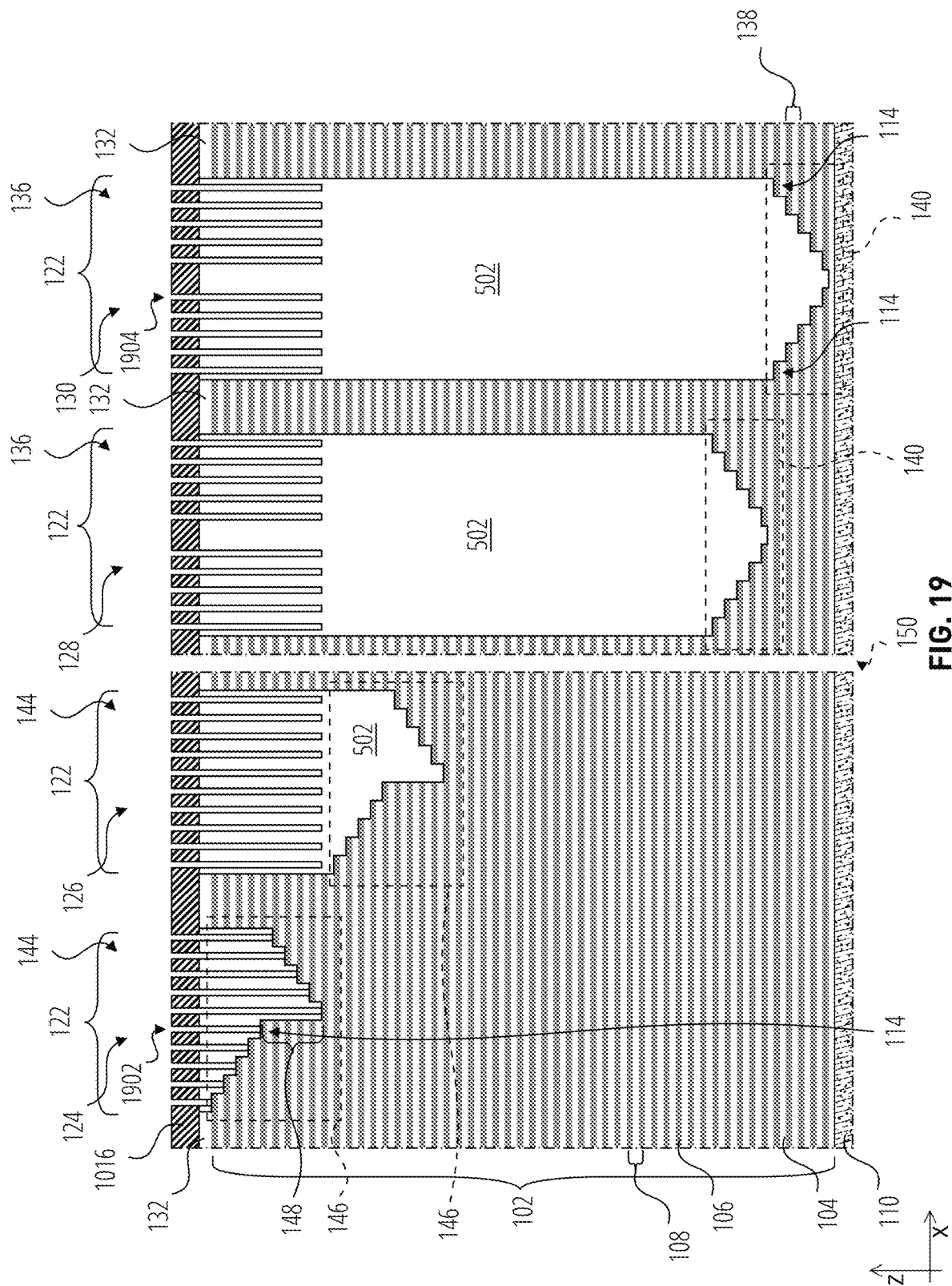

In some embodiments, the openings 1802 formed in the hardmask 1016 are extended (e.g., etched) downward into the dielectric material(s) 502 in a series of etching acts across the series of stadium areas (e.g., horizontal area of the stadiums 122) until the steps 114 are reached. For example, the dielectric material(s) 502 may be etched via the openings 1802 to form, as illustrated in FIG. 19, complete contact openings 1902 to the steps 114 of the first stadium 124, while forming initial partial openings 1904 that terminate in the dielectric material(s) 502, not yet reaching their respective steps 114 of the deeper stadiums 122 (e.g., the second stadium 126, the third stadium 128, the fourth stadium 130). The complete contact openings 1902 expose a portion of the steps 114 to which step contacts 116 (FIG. 1) are to be formed. The initial partial openings 1904 do not yet expose any portion of the steps 114.

Figure 20:
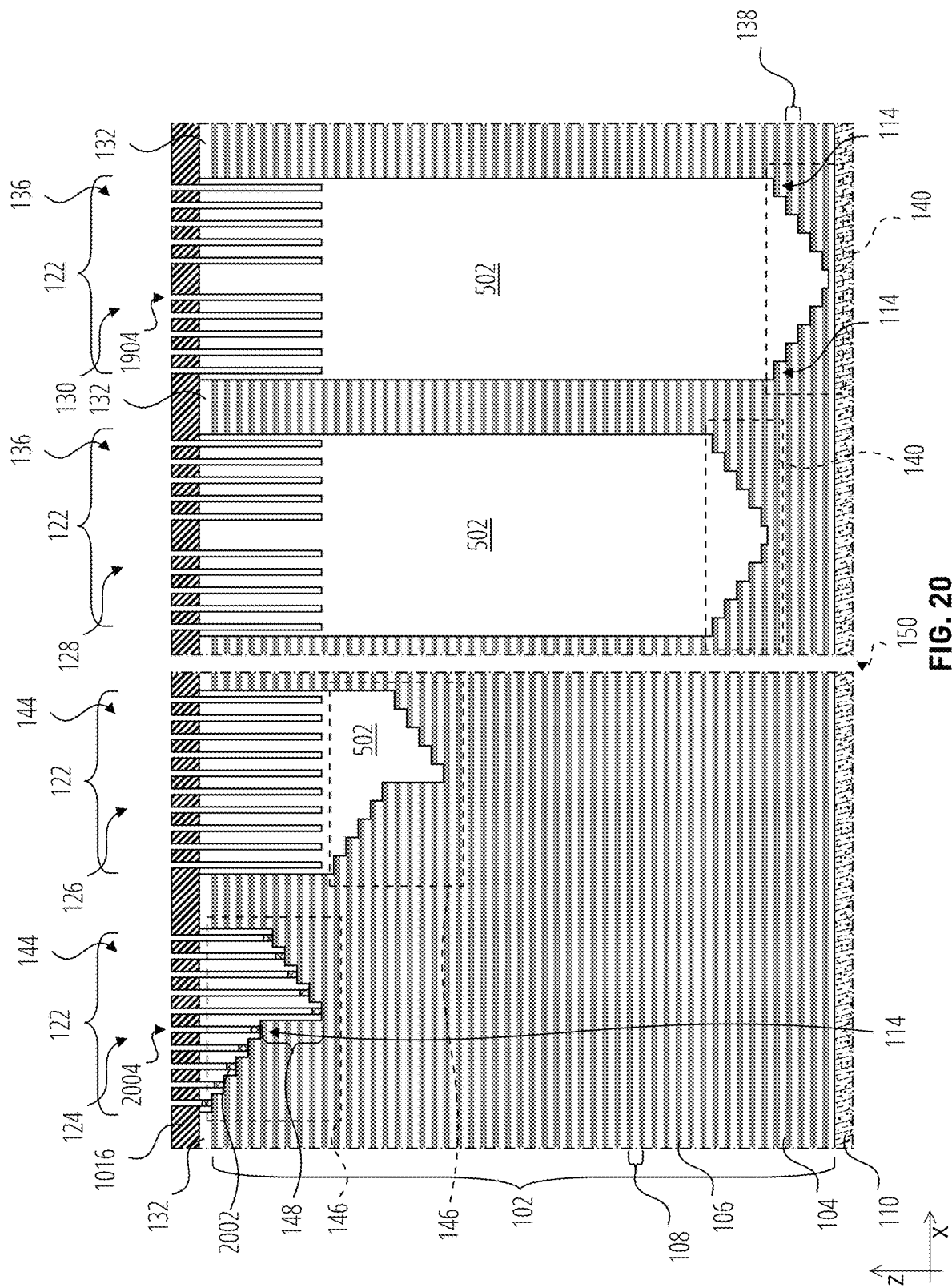

With reference to FIG. 20, a sacrificial material 2002 is formed in the complete contact openings 1902 (FIG. 19) to form base-plugged contact openings 2004. The sacrificial material 2002 may be formed of and include, for example, one or more polymer material(s), which may be by-product(s) of etchant(s) used to form the contact openings (e.g., the complete contact openings 1902 (FIG. 19) and the initial partial openings 1904). For example, etchant(s) may be introduced (e.g., in gaseous form) to the areas across the whole structure that are exposed through the hardmask 1016. By tailoring the composition of the etchant chemistry (e.g., the relative amounts of chemical species in the etchant chemistry), the sacrificial material 2002 (e.g., the polymer material(s)) may exhibit a lower etch rate compared to the etch rate of the dielectric material(s) 502, and the sacrificial material 2002 may accumulate in the complete contact openings 1902 (FIG. 19), to form the base-plugged contact openings 2004, while not substantially accumulating in (and not substantially inhibiting continued etching of the dielectric material(s) 502 in) not-yet completed contact openings (e.g., in the initial partial openings 1904). For example, an etchant composition may comprise oxygen ($O_2$) and carbon fluoride(s) (e.g., $C_xF_y$), and a relatively greater oxygen ($O_2$)

concentration may yield relatively less formation of the sacrificial material 2002 (e.g., polymer material(s)), a relatively higher carbon (C) concentration may yield relatively greater formation of the sacrificial material 2002, and a relatively higher fluorine (F) concentration may yield relatively less formation of the sacrificial material 2002. Therefore, the flow of the $O_2$ and the ratio of the carbon (C) and fluorine (F) (e.g., the "x" and the "y," respectively, in $C_xF_y$) may be adjusted and/or otherwise tailored to control the relative accumulation of the sacrificial material 2002 in the base-plugged contact openings 2004 without significantly inhibiting etching of the dielectric material(s) 502 in the not-yet-complete contact openings (e.g., the initial partial openings 1904). Accordingly, the sacrificial material 2002 may substantially accumulate only in the base of the complete contact openings 1902 (FIG. 19)—where the steps 114 are partially exposed—and not in the initial partial openings 1904—that are defined substantially only in the dielectric material(s) 502. The presence of the sacrificial material 2002 in the base-plugged contact openings 2004 may inhibit etching of the conductive structures 106 during subsequent material-removal acts.

Figure 21:
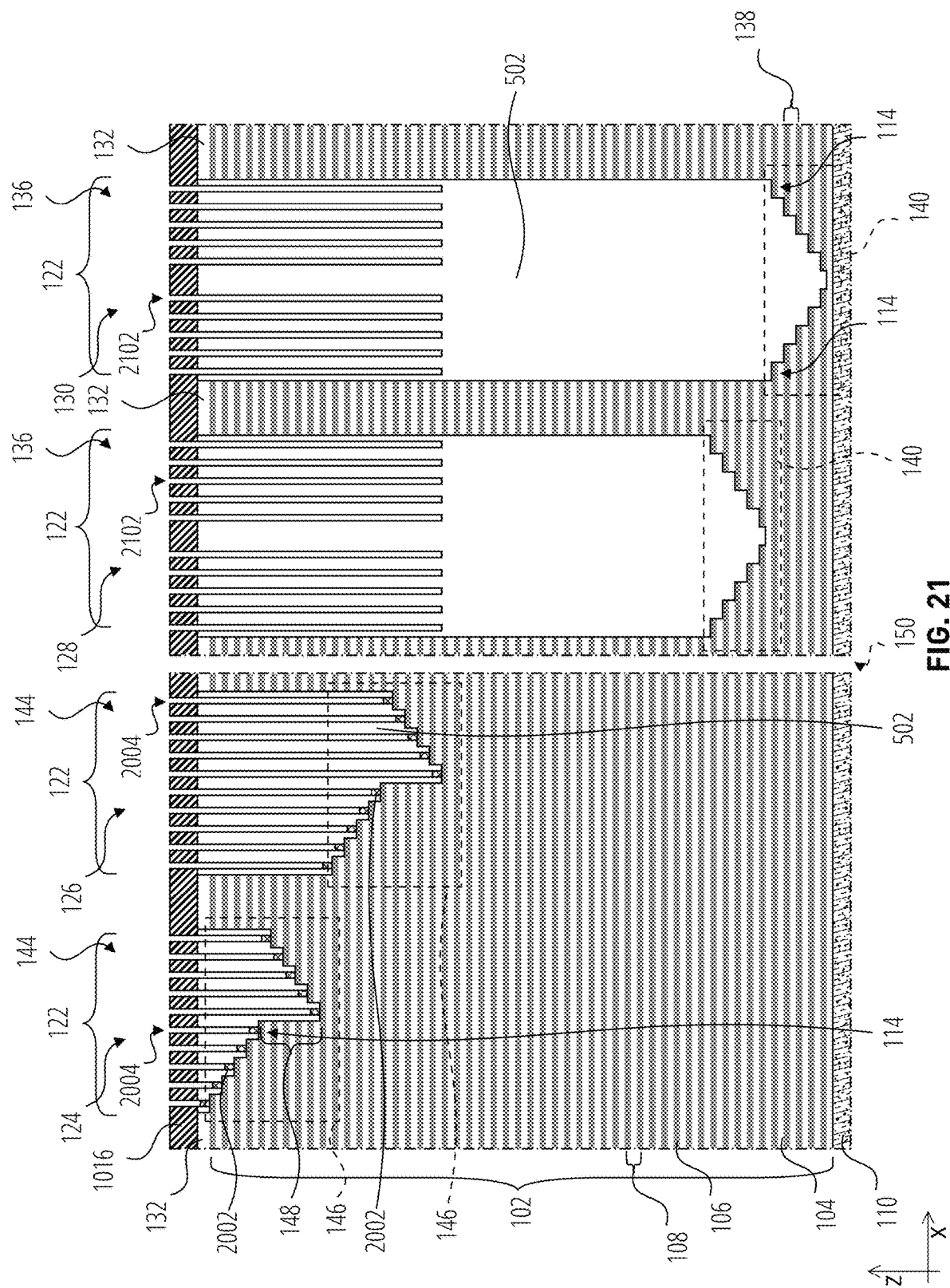
Figure 22:
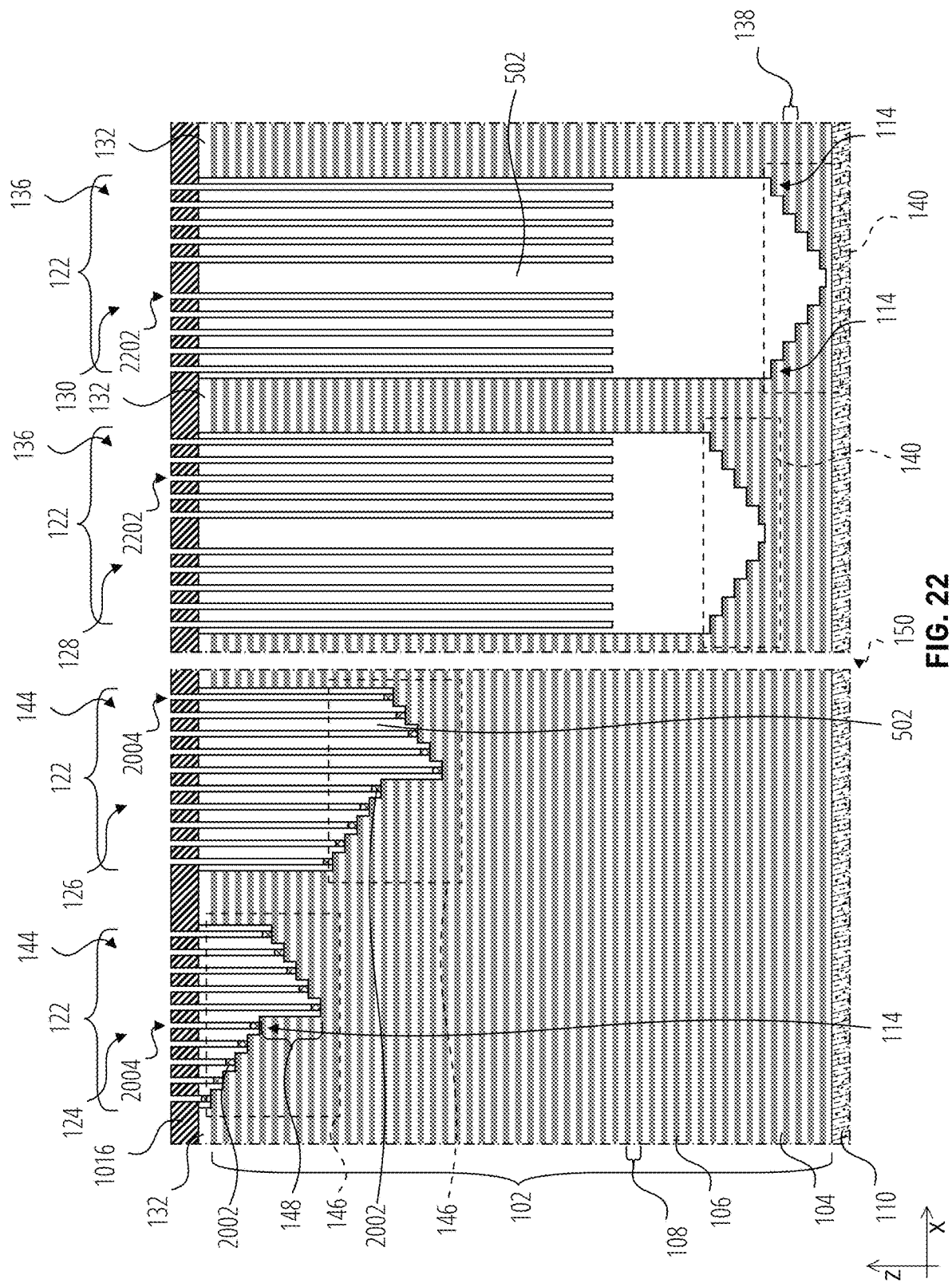

The initial partial openings 1904 are then extended downward for each of the stadiums 122 where the openings have not yet reached their respective steps 114. The initial partial openings 1904 may be extended to form complete contact openings 1902 (FIG. 19) to the second stadium 126 and to form extended partial openings 2102 toward other stadiums 122 (e.g., in the third stadium 128 and the fourth stadium 130), as illustrated in FIG. 21. The sacrificial material 2002 may, again, accumulate to form the base-plugged contact openings 2004 for the second stadium 126, substantially without the sacrificial material 2002 accumulating in the extended partial openings 2102, which are defined substantially wholly in the dielectric material(s) 502. These extensions and sacrificial material 2002 formation stages are repeated for the deeper and deeper stadiums 122.

Though the sacrificial material 2002 may be formulated and intended to form (e.g., accumulate) substantially only directly on the conductive structures 106 of exposed portions of the steps 114 in complete contact openings 1902 (FIG. 19), in some implementations of these fabrication stages, some sacrificial material 2002 may inadvertently accumulate within partially-formed openings, such as in a further extended partial opening 2202 (FIG. 22) in the not-yet completed openings toward the relatively-deeper stadiums 122 (e.g., the third stadium 128, the fourth stadium 130). This may result in a fabrication error (e.g., so-called "under etching") that could result in formation of the underformed step contact 604 illustrated in FIG. 6. This fabrication error may be more likely in the deepest stadiums 122 (e.g., the third stadium 128, the fourth stadium 130) given the greater number of times these partial contact openings, of these deeper stadiums 122, are exposed to the sacrificial material 2002 before completion of these contact openings. However, by forming multiple step contacts 116 (FIG. 1) per stepped tier 138 of one or more of the stadiums 122 (e.g., the deepest stadiums 122) most prone to these fabrication errors, the likelihood of at least one of the multiple step contacts 116 (FIG. 1) being accurately fabricated so as to provide electrical communication to the stepped tier 138 is significantly increased.

Figure 23:
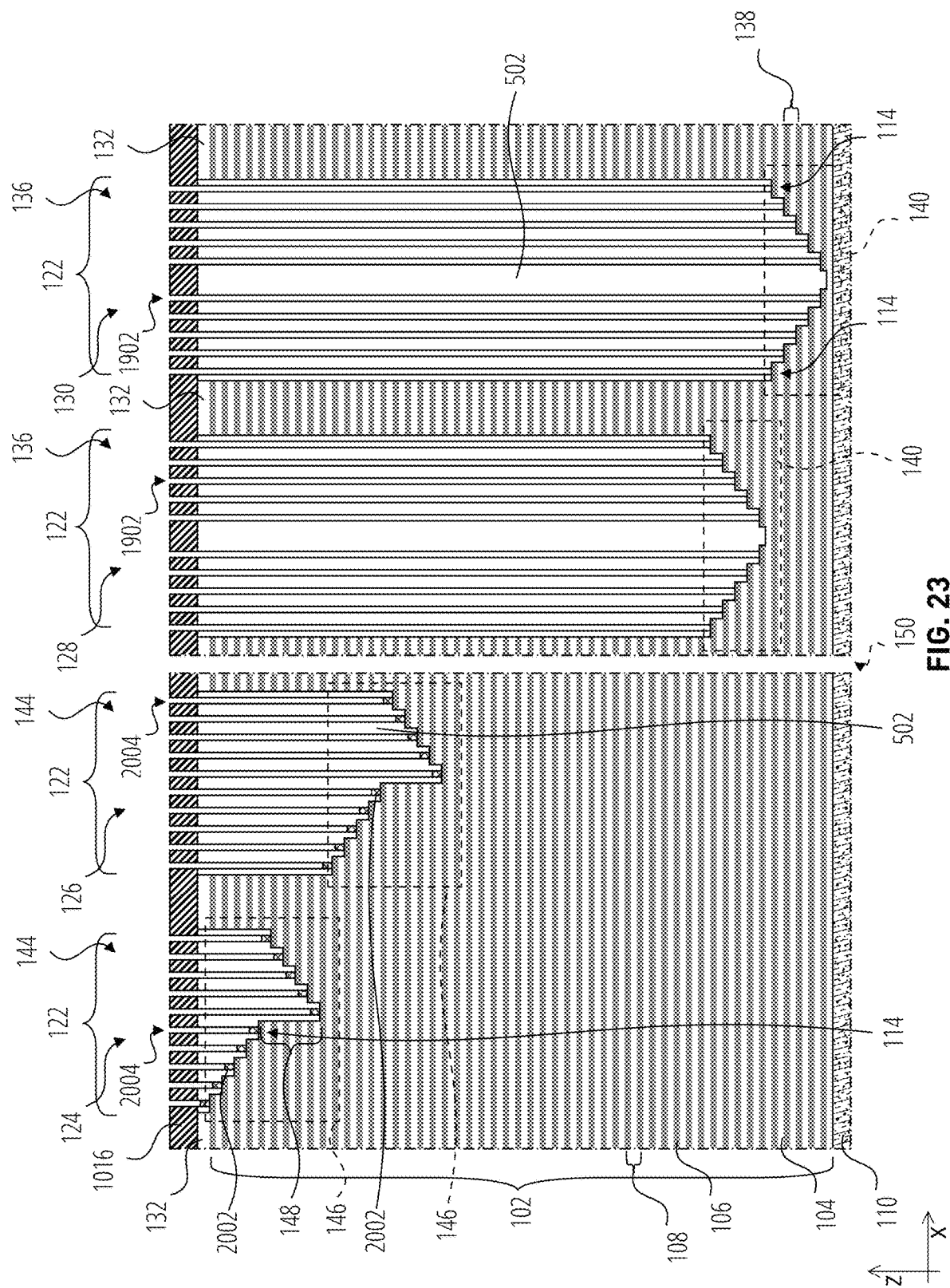

Absent fabrication errors, and at least in the further extended partial openings 2202 not inadvertently plugged with the sacrificial material 2002, further extensions of the openings forms complete contact openings 1902 to the remaining stadiums 122, as illustrated in FIG. 23.

Figure 24:
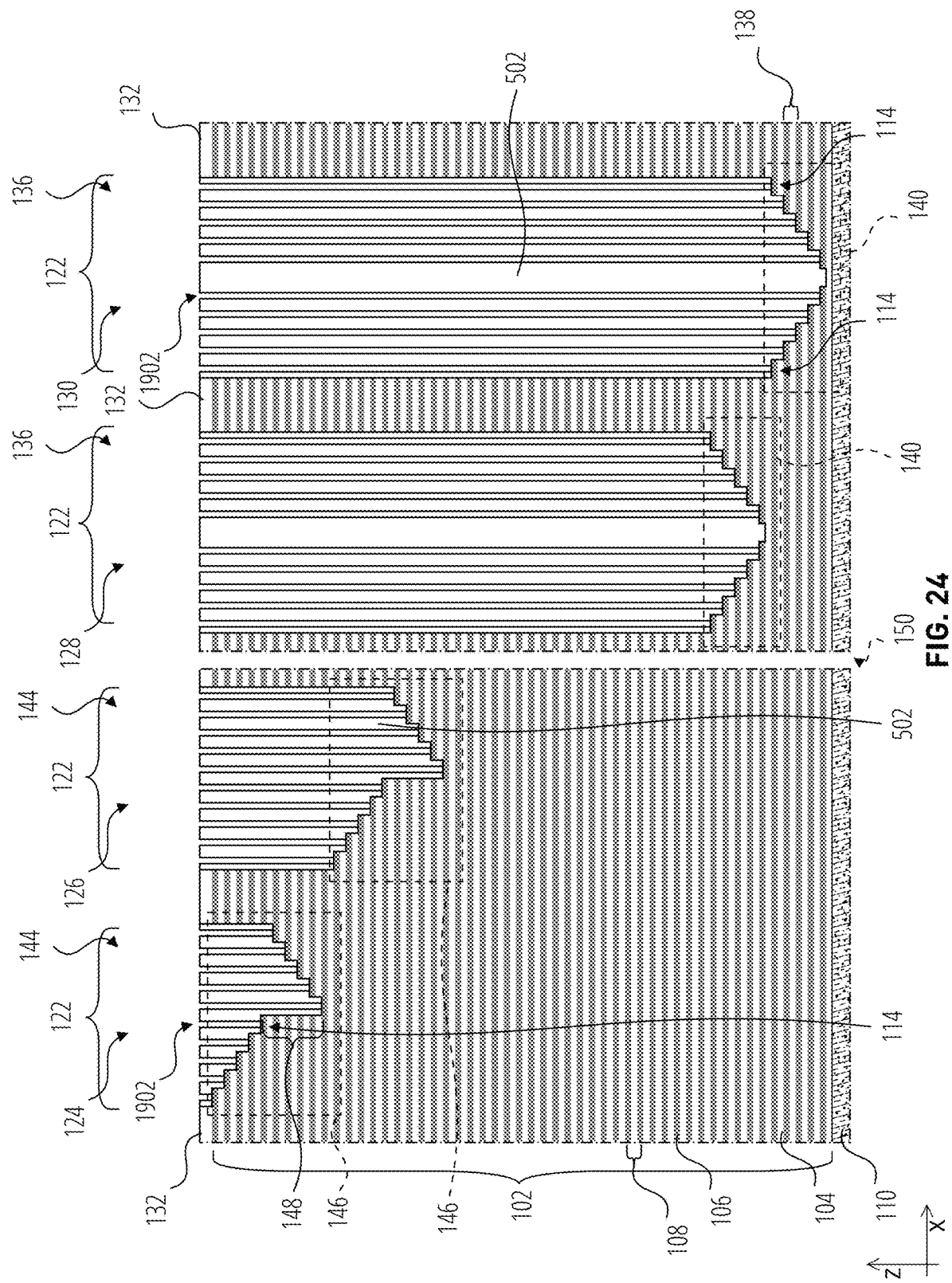

The sacrificial material 2002 may be removed (e.g., etched) from the base-plugged contact openings 2004 to complete the formation of the complete contact openings 1902 for the step contacts 116 (FIG. 1) to each of the stadiums 122, as illustrated in FIG. 24, with a portion of each step 114 exposed in the complete contact openings 1902.

In some embodiments, the hardmask 1016 may be removed (e.g., etched, planarized) at this or later stages.

Figure 25:
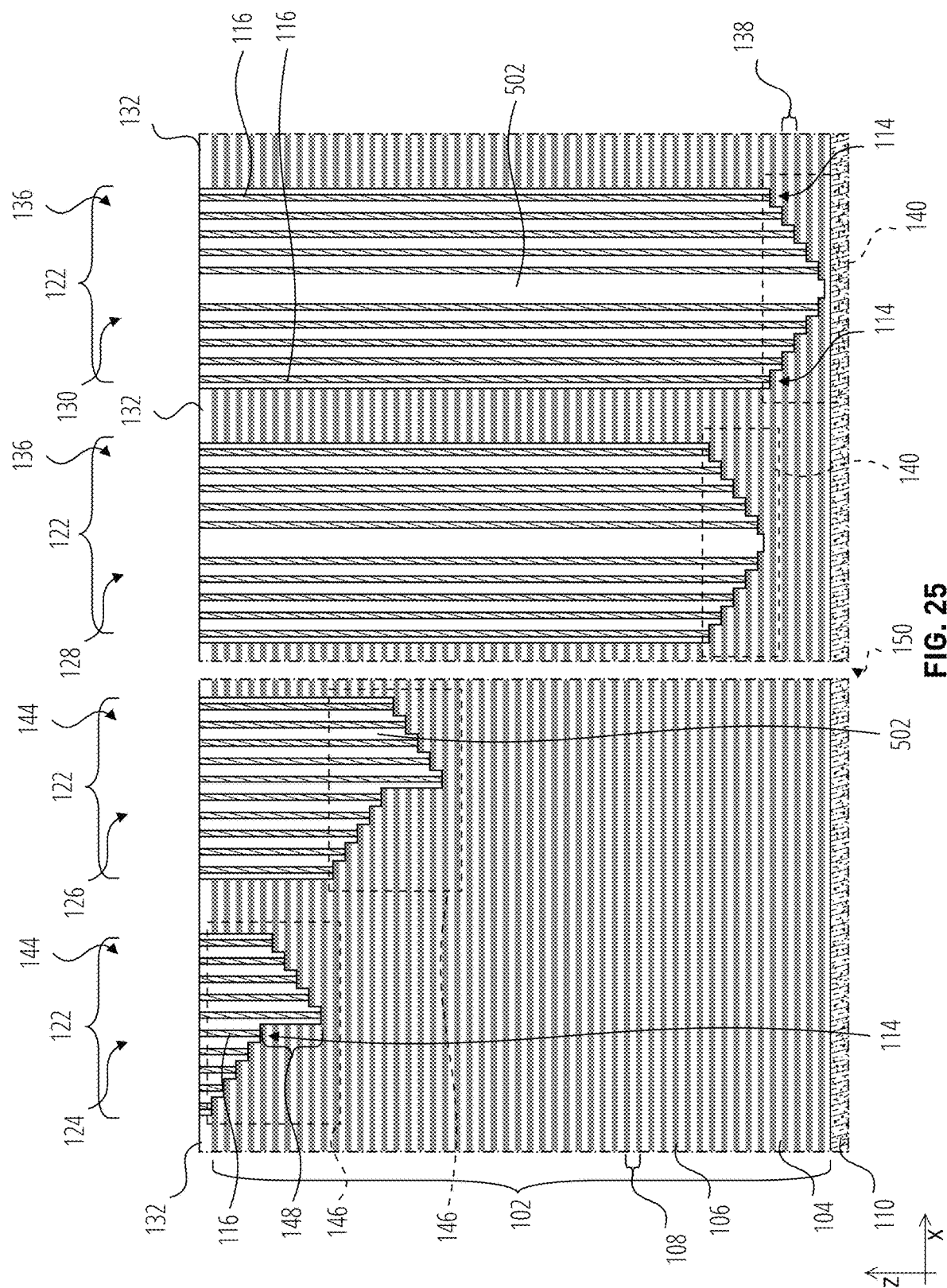

In the complete contact openings 1902, the material(s) of the step contacts 116 are formed (e.g., deposited) to complete the formation of the step contacts 116, as illustrated in FIG. 25.

The through-stack contacts 404 (FIG. 4) may be formed, such as in the crests 132 of the stack 102, and may be formed to couple to conductive features under the stack 102 (e.g., CuA circuitry, string driver circuitry). The routing lines 402 (FIG. 4) are formed to complete the electrical connections between the step contacts 116 and their respective through-stack contacts 404 to form the microelectronic device structure (e.g., the microelectronic device structure 100 of FIG. 1, the microelectronic device structure 700 of FIG. 7, the microelectronic device structure 800 of FIG. 8, the microelectronic device structure 900 of FIG. 9).

Accordingly, disclosed is a method of forming a microelectronic device. The method comprises forming a tiered stack on a base structure. The tiered stack comprises a vertically alternating sequence of insulative structures and other structures. Stadiums are formed in the tiered stack. Each of the stadiums includes one or more staircases at least partially defined by horizontal ends of some of the other structures. At least one dielectric material is formed within trenches vertically overlying the stadiums. Contact openings are formed through the at least one dielectric material. At least one pair of the contact openings vertically extends to a common one of the other structures. A conductive contact structure is formed in each of the contact openings.

Figure 26:
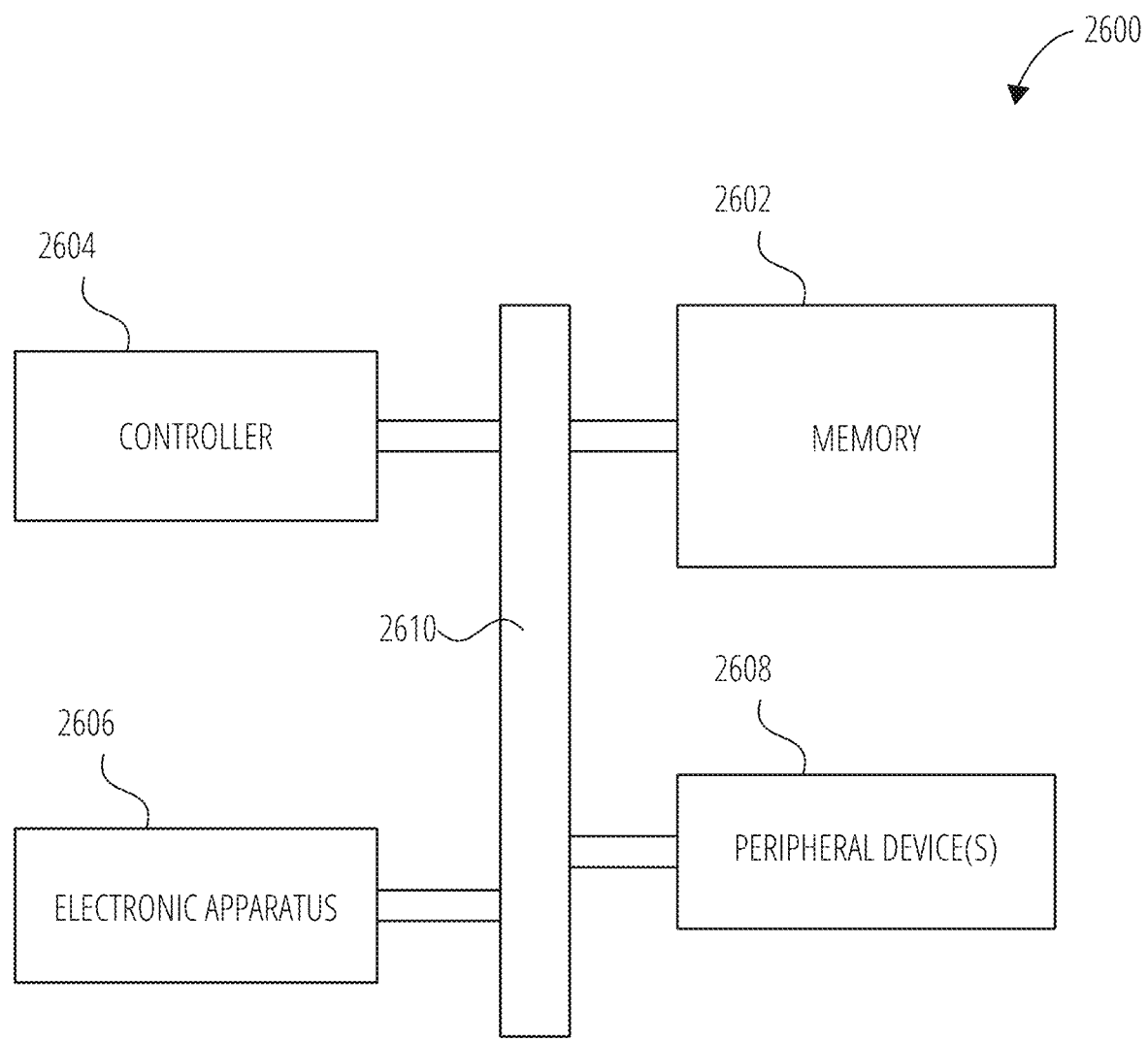
FIG. 26 is a block diagram of an electronic system including a microelectronic device that includes at least one microelectronic device structure of embodiments of the disclosure.

FIG. 26 shows a block diagram of a system 2600, according to embodiments of the disclosure, which system 2600 includes memory 2602 including arrays of vertical strings of memory cells adjacent microelectronic device structure(s) (e.g., microelectronic device structure 100 of FIG. 1 and FIG. 4, FIG. 5, and/or FIG. 6; microelectronic device structure 700 of FIG. 7; microelectronic device structure 800 of FIG. 8; microelectronic device structure 900 of FIG. 9). Therefore, the architecture and structure of the memory 2602 may include one or more device structures according to embodiments of the disclosure and may be fabricated according to one or more of the methods described above (e.g., with reference to FIG. 10 through FIG. 25).

The system 2600 may include a controller 2604 operatively coupled to the memory 2602. The system 2600 may also include another electronic apparatus 2606 and one or more peripheral device(s) 2608. The other electronic apparatus 2606 may, in some embodiments, include one or more of microelectronic device structures (e.g., microelectronic device structure 100 of FIG. 1 and FIG. 4, FIG. 5, and/or FIG. 6; microelectronic device structure 700 of FIG. 7; microelectronic device structure 800 of FIG. 8; microelectronic device structure 900 of FIG. 9), according to embodiments of the disclosure and fabricated according to one or more of the methods described above. One or more of the controller 2604, the memory 2602, the other electronic apparatus 2606, and the peripheral device(s) 2608 may be in the form of one or more integrated circuits (ICs).

A bus 2610 provides electrical conductivity and operable communication between and/or among various components of the system 2600. The bus 2610 may include an address bus, a data bus, and a control bus, each independently configured. Alternatively, the bus 2610 may use conductive lines for providing one or more of address, data, or control, the use of which may be regulated by the controller 2604. The controller 2604 may be in the form of one or more processors.

The other electronic apparatus 2606 may include additional memory (e.g., with one or more microelectronic device structures (e.g., microelectronic device structure 100 of FIG. 1 and FIG. 4, FIG. 5, and/or FIG. 6; microelectronic device structure 700 of FIG. 7; microelectronic device structure 800 of FIG. 8; microelectronic device structure 900 of FIG. 9), according to embodiments of the disclosure and fabricated according to one or more of the methods described above). Other memory structures of the memory 2602 and/or the other electronic apparatus 2606 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 2608 may include displays, imaging devices, printing devices, wireless devices, additional storage memory, and/or control devices that may operate in conjunction with the controller 2604.

The system 2600 may include, for example, fiber optics systems or devices, electro-optic systems or devices, optical systems or devices, imaging systems or devices, and information handling systems or devices (e.g., wireless systems or devices, telecommunication systems or devices, and computers).

Accordingly, disclosed is an electronic system comprising a three-dimensional memory device, at least one processor, and at least one peripheral device. The three-dimensional memory device comprises a stack structure comprising conductive structures vertically alternating with insulative structures and arranged in tiers. A series of staircased stadiums is defined in a block of the stack structure. Pairs of step contacts extend, through dielectric material overlying at least one of the stadiums, to mutual ones of the conductive structures defining at least one step of the at least one stadium. The at least one processor is in operable communication with the three-dimensional memory device. The at least one peripheral device is in operable communication with the at least one processor.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
a stack structure comprising a vertically alternating sequence of insulative structures and conductive structures arranged in tiers, each of the tiers comprising at least one of the conductive structures and at least one of the insulative structures; stadiums within the stack structure, at least one of the stadiums comprising two staircases having steps provided by a group of the conductive structures, each of the conductive structures of the group individually providing a continuous conductive region across the two staircases of the at least one of the stadiums; and
step contacts extending to the steps of the two staircases of the at least one of the stadiums, each conductive structure of the group of conductive structures having more than one of the step contacts in contact therewith at at least one of the steps of the two staircases.

2. The microelectronic device of claim 1, wherein the two staircases of the at least one of the stadiums are located at a same vertical position within the stack structure as one another.

3. The microelectronic device of claim 1, wherein the two staircases of the at least one of the stadiums mirror one another.

4. The microelectronic device of claim 1, wherein the two staircases of the at least one of the stadiums comprise a first staircase having negative slope descending toward a second staircase having positive slope.

5. The microelectronic device of claim 1, wherein the two staircases of the at least one of the stadiums comprise a first staircase having positive slope ascending toward a second staircase having negative slope.

6. The microelectronic device of claim 1, wherein the two staircases of the at least one of the stadiums each have positive slope or each have negative slope.

7. The microelectronic device of claim 1, wherein at least one other of the stadiums has only one staircase provided by an additional group of the conductive structures.

8. The microelectronic device of claim 1, wherein at least one other of the stadiums comprises two additional staircases vertically offset from one another.

9. The microelectronic device of claim 8, wherein the two additional staircases of the at least one other of the stadiums comprise a first staircase having negative slope descending toward a second staircase having positive slope, a lowest of the steps of the first staircase being vertically above a lowest of the steps of the second staircase.

10. The microelectronic device of claim 8, wherein the two additional staircases of the at least one other of the stadiums comprise a first staircase having negative slope descending toward a second staircase having positive slope, a lowest of the steps of the first staircase being vertically below a lowest of the steps of the second staircase.

11. The microelectronic device of claim 8, wherein the two additional staircases of the at least one other of the stadiums comprise a first staircase having positive slope ascending toward a second staircase having negative slope, a highest of the steps of the first staircase being vertically above a highest of the steps of the second staircase.

12. The microelectronic device of claim 8, wherein the two additional staircases of the at least one other of the stadiums comprise a first staircase having positive slope ascending toward a second staircase having negative slope, a highest of the steps of the first staircase being vertically below a highest of the steps of the second staircase.

13. The microelectronic device of claim 1, wherein at least one pair of the step contacts sharing electrical communication with one of the conductive structures of the group of the conductive structures also share electrical communication with a conductive routing structure overlying the stack structure and with a conductive contact structure vertically extending completely through the stack structure.

14. The microelectronic device of claim 13, wherein the step contacts of the at least one pair of the step contacts are within a horizontal area of a common one of the at least one of the stadiums.

15. The microelectronic device of claim 13, wherein the step contacts of the at least one pair of the step contacts are each within a horizontal area of different ones of the at least one of the stadiums than one another.

16. The microelectronic device of claim 13, wherein the step contacts of the at least one pair of the step contacts extend to a common one of the steps of the two staircases of the at least one of the stadiums.

17. The microelectronic device of claim 16, wherein the conductive contact structure is disposed in a horizontal area of a crest region of the stack structure between horizontally neighboring stadiums of the stadiums.

18. The microelectronic device of claim 16, wherein each pair, of the at least one pair of the step contacts sharing the electrical communication with the one of the conductive structures of the group of the conductive structures, share electrical communication with different conductive contact structures than one another, the conductive contact structures extending completely through the stack structure.

19. A microelectronic device, comprising:
    a stack structure comprising insulative structures vertically interleaved with conductive structures and arranged in tiers;
    a series of stadiums in the stack structure, at least one of the stadiums having steps at least partially defined by the conductive structures of a first group of the tiers, and at least one other of the stadiums having additional steps at least partially defined by the conductive structures of a second group of the tiers, the first group of the tiers being at elevations lower than elevations of the second group of the tiers; and
    conductive contacts within horizontal areas of stadiums of the series of stadiums, the conductive contacts comprising:
        pairs of the conductive contacts, each of the pairs of the conductive contacts extending to a different one of the conductive structures of the first group of the tiers than each other of the pairs of the conductive contacts; and
        ones of the conductive contacts each extending to a different one of the conductive structures of the second group of the tiers than each other of the ones of the conductive contacts.

20. A method of forming a microelectronic device, the method comprising:
    forming a tiered stack on a base structure, the tiered stack comprising a vertically alternating sequence of insulative structures and other structures;
    forming stadiums in the tiered stack, each of the stadiums including one or more staircases at least partially defined by horizontal ends of some of the other structures, forming the stadiums in the tiered stack comprising:
        defining, in upper elevations of the tiered stack, staircase profiles for the stadiums; and
        extending the staircase profiles of at least some of the stadiums to lower elevations within the tiered stack than elevations of the staircase profiles of at least some others of the stadiums;
    forming at least one dielectric material within trenches vertically overlying the stadiums;
    forming contact openings through the at least one dielectric material, at least one pair of the contact openings vertically extending to a common one of the other structures; and
    forming a conductive contact structure in each of the contact openings.

21. The method of claim 20, wherein defining, in the upper elevations of the tiered stack, the staircase profiles for the stadiums comprises defining at least one of the staircase profiles to include a pair of opposing staircases.

22. The method of claim 21, further comprising, before extending the staircase profiles of the at least some of the stadiums:
    vertically offsetting one of the opposing staircases, of the pair of opposing staircases, in the at least one of the staircase profiles.

23. The method of claim 20, wherein each of the contact openings exposes a surface portion of one of the other structures and forming the contact openings through the at least one dielectric material comprises:
    forming initial contact openings through the upper elevations of the at least one dielectric material, some of the initial contact openings forming some of the contact openings, some others of the initial contact openings terminating in the at least one dielectric material;
    forming a sacrificial material on the surface portion of the one of the other structures exposed by forming the some of the initial contact openings;
    extending the some others of the initial contact openings further into the at least one dielectric material to form some others of the contact openings; and
    before forming the conductive contact structure in each of the contact openings, removing the sacrificial material.

24. An electronic system, comprising:
    a three-dimensional memory device comprising:
        a stack structure comprising conductive structures vertically alternating with insulative structures and arranged in tiers;
        a series of staircased stadiums defined in a block of the stack structure; and
        pairs of step contacts extending, through dielectric material overlying at least one of the stadiums, to mutual ones of the conductive structures defining at least one step of the at least one stadium, each of the mutual ones of the conductive structures individually defining a continuous conductive region across the series of staircased stadiums;
    at least one processor in operable communication with the three-dimensional memory device; and
    at least one peripheral device in operable communication with the at least one processor.

* * * * *